United States Patent
Yang et al.

(10) Patent No.: US 11,114,434 B2
(45) Date of Patent: Sep. 7, 2021

(54) COMPUTATION-IN-MEMORY IN THREE-DIMENSIONAL MEMORY DEVICE

(71) Applicant: YANGTZE MEMORY TECHNOLOGIES CO., LTD., Wuhan (CN)

(72) Inventors: Shengwei Yang, Wuhan (CN); Zhongyi Xia, Wuhan (CN); Kun Han, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 0 days.

(21) Appl. No.: 16/542,274

(22) Filed: Aug. 15, 2019

(65) Prior Publication Data
US 2020/0411509 A1    Dec. 31, 2020

Related U.S. Application Data

(63) Continuation of application No. PCT/CN2019/093519, filed on Jun. 28, 2019.

(51) Int. Cl.
*H01L 27/06* (2006.01)
*G11C 16/10* (2006.01)
(Continued)

(52) U.S. Cl.
CPC .......... *H01L 27/0688* (2013.01); *G11C 16/10* (2013.01); *G11C 29/52* (2013.01); *H01L 27/14636* (2013.01)

(58) Field of Classification Search
CPC .......... H01L 27/0688; H01L 27/14636; G11C 16/10; G11C 29/52
(Continued)

(56) References Cited

U.S. PATENT DOCUMENTS 6,593,624 B2 * 7/2003 Walker ............... H01L 27/0688
257/324
7,897,448 B1 * 3/2011 Mehta ................... G11C 16/10
438/201
(Continued)

FOREIGN PATENT DOCUMENTS

CN    1770454 A    5/2006
CN    103635970 A    3/2014
(Continued)

OTHER PUBLICATIONS

International Search Report issued in corresponding International Application No. PCT/CN2019/093519, dated Mar. 30, 2020, 4 pages.
(Continued)

*Primary Examiner* — Sheikh Maruf
(74) *Attorney, Agent, or Firm* — Bayes PLLC

(57) ABSTRACT

Three-dimensional (3D) memory devices are provided. An exemplary 3D memory device includes a first semiconductor structure including a peripheral circuit, a data processing circuit, and a first bonding layer including a plurality of first bonding contacts. The 3D memory device also includes a second semiconductor structure including an array of 3D NAND memory strings and a second bonding layer including a plurality of second bonding contacts. In addition, the 3D memory device includes a bonding interface between the first bonding layer and the second bonding layer. The first bonding contacts are in contact with the second bonding contacts at the bonding interface.

14 Claims, 14 Drawing Sheets

(51) Int. Cl.
*G11C 29/52* (2006.01)
*H01L 27/146* (2006.01)

(58) Field of Classification Search
USPC ........................................................ 257/324
See application file for complete search history.

(56) References Cited

U.S. PATENT DOCUMENTS

| | | | | |
|---|---|---|---|---|
| 2002/0142546 | A1* | 10/2002 | Kouznetsov | H01L 29/792 |
| | | | | 438/257 |
| 2004/0214379 | A1* | 10/2004 | Lee | H01L 27/11526 |
| | | | | 438/149 |
| 2005/0007822 | A1* | 1/2005 | Lee | G11C 16/0425 |
| | | | | 365/185.11 |
| 2005/0258482 | A1* | 11/2005 | Ito | H01L 27/112 |
| | | | | 257/336 |
| 2007/0043938 | A1* | 2/2007 | May | G06F 9/4401 |
| | | | | 713/2 |
| 2010/0044846 | A1* | 2/2010 | Ohmi | H01L 27/0688 |
| | | | | 257/686 |
| 2011/0194369 | A1* | 8/2011 | Jeddeloh | G11C 11/406 |
| | | | | 365/222 |
| 2012/0159270 | A1* | 6/2012 | Jeddeloh | H01L 27/10897 |
| | | | | 714/708 |
| 2012/0243336 | A1* | 9/2012 | Nishi | G11C 16/0458 |
| | | | | 365/185.27 |
| 2013/0095580 | A1* | 4/2013 | Or-Bach | H01L 27/088 |
| | | | | 438/17 |
| 2013/0248959 | A1* | 9/2013 | Matsumoto | H01L 27/088 |
| | | | | 257/314 |
| 2014/0061765 | A1* | 3/2014 | Zaitsu | H01L 29/792 |
| | | | | 257/324 |
| 2014/0181417 | A1 | 6/2014 | Loh et al. | |
| 2015/0036437 | A1* | 2/2015 | Li | G11C 16/14 |
| | | | | 365/185.33 |
| 2016/0098200 | A1 | 4/2016 | Guz et al. | |
| 2017/0179155 | A1* | 6/2017 | Or-Bach | H01L 27/249 |
| 2017/0213821 | A1* | 7/2017 | Or-Bach | G11C 5/147 |
| 2018/0053545 | A1 | 2/2018 | Son | |
| 2018/0151583 | A1* | 5/2018 | Lupino | H01L 27/11556 |
| 2018/0261600 | A1* | 9/2018 | Or-Bach | H01L 27/10897 |
| 2018/0269229 | A1* | 9/2018 | Or-Bach | H01L 29/42392 |
| 2018/0307614 | A1 | 10/2018 | Luo et al. | |
| 2018/0308555 | A1* | 10/2018 | Zhang | G11C 16/0483 |
| 2018/0374557 | A1 | 12/2018 | Jeddeloh | |
| 2018/0374864 | A1* | 12/2018 | Fukuzumi | H01L 24/00 |
| 2019/0043836 | A1* | 2/2019 | Fastow | H01L 25/0657 |
| 2019/0057959 | A1* | 2/2019 | Or-Bach | H01L 27/14634 |
| 2019/0057974 | A1* | 2/2019 | Lu | H01L 27/11565 |
| 2019/0067109 | A1* | 2/2019 | Or-Bach | H01L 23/36 |
| 2019/0074222 | A1 | 3/2019 | Or-Bach et al. | |
| 2019/0205244 | A1 | 7/2019 | Smith | |
| 2019/0244933 | A1* | 8/2019 | Or-Bach | G11C 11/5628 |
| 2020/0125294 | A1 | 4/2020 | Parker | |

FOREIGN PATENT DOCUMENTS

| | | |
|---|---|---|
| CN | 104576646 A | 4/2015 |
| CN | 105097019 A | 11/2015 |
| CN | 105761739 A | 7/2016 |
| CN | 107658315 A | 2/2018 |
| CN | 107980173 A | 4/2018 |
| CN | 109545764 A | 3/2019 |
| CN | 109564923 A | 4/2019 |
| TW | 201834221 A | 9/2018 |
| TW | 201913966 A | 4/2019 |

OTHER PUBLICATIONS

International Search Report issued in corresponding International Application No. PCT/CN2019/093519, dated Mar. 30, 2020, 5 pages.

* cited by examiner

COMPUTATION-IN-MEMORY IN THREE-DIMENSIONAL MEMORY DEVICE

CROSS REFERENCE TO RELATED APPLICATION

This application is continuation of International Application No. PCT/CN2019/093519, filed on Jun. 28, 2019, entitled "COMPUTATION-IN-MEMORY IN THREE-DIMENSIONAL MEMORY DEVICE," which is hereby incorporated by reference in its entirety. This application is also related to U.S. application Ser. No. 16/542,272, filed on even date, entitled "COMPUTATION-IN-MEMORY IN THREE-DIMENSIONAL MEMORY DEVICE," which is hereby incorporated by reference in its entirety.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices with on-die data processing capacity are disclosed herein.

In one example, a 3D memory device includes a first semiconductor structure including a peripheral circuit, a data processing circuit, and a first bonding layer including a plurality of first bonding contacts. The 3D memory device also includes a second semiconductor structure including an array of 3D NAND memory strings and a second bonding layer including a plurality of second bonding contacts. The 3D memory device further includes a bonding interface between the first bonding layer and the second bonding layer. The first bonding contacts are in contact with the second bonding contacts at the bonding interface.

In another example, a method for forming a 3D memory device includes forming a first semiconductor structure including a peripheral circuit, a data processing circuit, and a first bonding layer including a plurality of first bonding contacts. The method also includes forming a second semiconductor structure including an array of 3D NAND memory strings and a second bonding layer including a plurality of second bonding contacts. The method further includes bonding the first semiconductor structure and the second semiconductor structure in a face-to-face manner, such that the first bonding contacts are in contact with the second bonding contacts at a bonding interface.

In still another example, a method for operating a 3D memory device including an input/output circuit, a data processing circuit, and an array of 3D NAND memory strings in a same chip includes transferring control instructions through the input/output circuit to the data processing circuit. The method also includes processing, by the data processing circuit, data stored in the array of 3D NAND memory strings based on the control instructions. The method further includes returning, through the input/output circuit, a data processing result.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
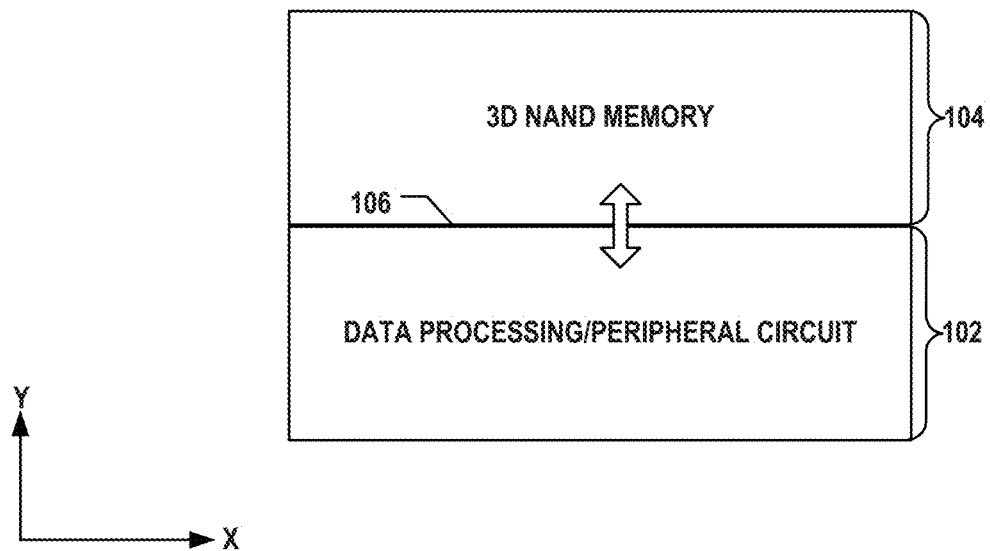
FIG. 1A illustrates a schematic view of a cross-section of an exemplary 3D memory device with a data processing circuit, according to some embodiments.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In conventional 3D memory devices, the peripheral circuits that are formed outside of memory array devices on the same plane can occupy a large area of the device chip, thereby leading to poor array efficiency, large die size, and high cost. Also, the thermal budget associated with processing the memory array device limits the peripheral circuit performance requirement, making it difficult to achieve high input/output (I/O) speed of the 3D memory device. Moreover, conventional 3D memory devices rely on external devices (e.g., not on the same chip as the memory device) to perform data processing operations. As a result, data stored on the 3D memory devices need to be loaded into an external data processing device through an I/O interface (e.g., a data bus) before being processed by the external data processing device, placing a heavy burden on the I/O interface especially when the amount of data is large. Therefore, the I/O interface often becomes the bottleneck limiting the overall throughput of the host system.

Due to considerations such as volume and cost, data processing circuits are often not formed in memory packages such as an embedded multi-media card (eMMC) o universal flash storage (UFS). On-chip or in-memory data processing operations are often not enabled in such memory packages. As a result, high-speed data processing in these memory packages can be limited. In another example, a memory device can use a considerable amount of resources (e.g., data buffers and data buses) to transmit data to an external data processing device through the I/O interface. This can slow down other operations. The overall performance of the memory device can be limited.

Various embodiments in accordance with the present disclosure provide a 3D memory device having an on-chip, in-memory data processing circuit (e.g., a logic circuit capable of performing data processing operations) with improved I/O speed, throughput, and memory density. The on-die data processing circuit can be formed on the same chip with peripheral circuits of the 3D memory device. The on-die data processing circuit can be placed in the area that is not occupied by the peripheral circuits (e.g., the spare space neighboring peripheral circuits) and thus, do not need extra space to be formed. The on-die data processing circuit can enable high-speed data processing operations on the data stored in memory cells of the 3D memory device. In an embodiment, the on-die data processing circuit is configured to perform logic operations such as searching, encryption, and preprocessing on data stored in the local memory array, and return an operation result to the I/O interface instead of loading the entirety of the underlying data to the I/O interface. The on-die data processing circuit can thus improve the I/O throughput.

FIG. 1A illustrates a schematic view of a cross-section of an exemplary 3D memory device 100 with a data processing circuit, according to some embodiments. As used herein, a data processing circuit refers to a logic circuit configured to perform data processing operations such as searching, encryption, and/or preprocessing on the underlying data. 3D memory device 100 represents an example of a non-monolithic 3D memory device. The term "non-monolithic" means that the components of 3D memory device 100 (e.g., peripheral circuit/data processing circuit and 3D NAND memory) can be formed separately on different substrates and then joined to form a 3D memory device. 3D memory device 100 can include a first semiconductor structure 102 including peripheral circuits and one or more data processing circuits. Both peripheral circuits and the data processing circuit(s) can be implemented with advanced logic processes (e.g., technology nodes of 90 nm, 80 nm, 65 nm, 55 nm, 45 nm, 40 nm, 32 nm, 28 nm, 22 nm, 20 nm, 16 nm, 14 nm, 10 nm, 7 nm, 5 nm, 3 nm, etc.) to achieve high speed. In some embodiments, the peripheral circuits and data processing circuit(s) in first semiconductor structure 102 use complementary metal-oxide-semiconductor (CMOS) technology.

In some embodiments, the peripheral circuits include any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). A data processing circuit is integrated on the same die of the peripheral circuits, enabling in-memory computation and data processing. The data processing circuit can be embedded along with the peripheral circuits. While peripheral circuits provide functionalities more closely related to the storage-based operations of memory device 100, the data processing circuit provides computational power to implement algorithmic-based operations to the data stored in 3D memory device 100.

3D memory device 100 can also include a second semiconductor structure 104 including an array of 3D NAND memory strings. That is, second semiconductor structure 104 can be a NAND Flash memory device in which memory cells are provided in the form of an array of NAND memory strings. In some embodiments, depending on the NAND technology (e.g., the number of levels/tiers in the memory stack), a 3D NAND memory string typically consists of 32 to 256 NAND memory cells. 3D NAND memory strings can be organized into pages which are then organized into blocks in which each 3D NAND memory string is connected to a separate line called a bit line (BL). All cells with the same position in the 3D NAND memory string can be connected through the control gates by a word line (WL). In some embodiments, a plane contains a certain number of blocks that are connected through the same bit line. Second semiconductor structure 104 can include one or more planes, and the peripheral circuits that are needed to perform all the read/write/erase operations can be included in first semiconductor structure 102.

As shown in FIG. 1A, 3D memory device 100 further includes a bonding interface 106 vertically between first semiconductor structure 102 and second semiconductor structure 104. As described below in detail, first and second semiconductor structures 102 and 104 can be fabricated separately (and in parallel in some embodiments) such that the thermal budget of fabricating one of first and second semiconductor structures 102 and 104 does not limit the processes of fabricating another one of first and second semiconductor structures 102 and 104. Moreover, a large number of interconnects (e.g., bonding contacts via hybrid bonding) can be formed through bonding interface 106 to make direct, short electrical connections between first semiconductor structure 102 and second semiconductor structure 104, as opposed to the long-distance chip-to-chip data bus on the circuit board, thereby eliminating chip interface delay and achieving high-speed I/O throughput with reduced power consumption. Data transfer between the array of 3D NAND memory strings in second semiconductor structure 104 and the data processing circuit in first semiconductor structure 102 can be performed through the interconnects (e.g., bonding contacts via hybrid bonding) across bonding interface 106. Furthermore, by vertically integrating first and second semiconductor structures 102 and 104, the chip size can be reduced, and the memory cell density can be increased.

Figure 1B:
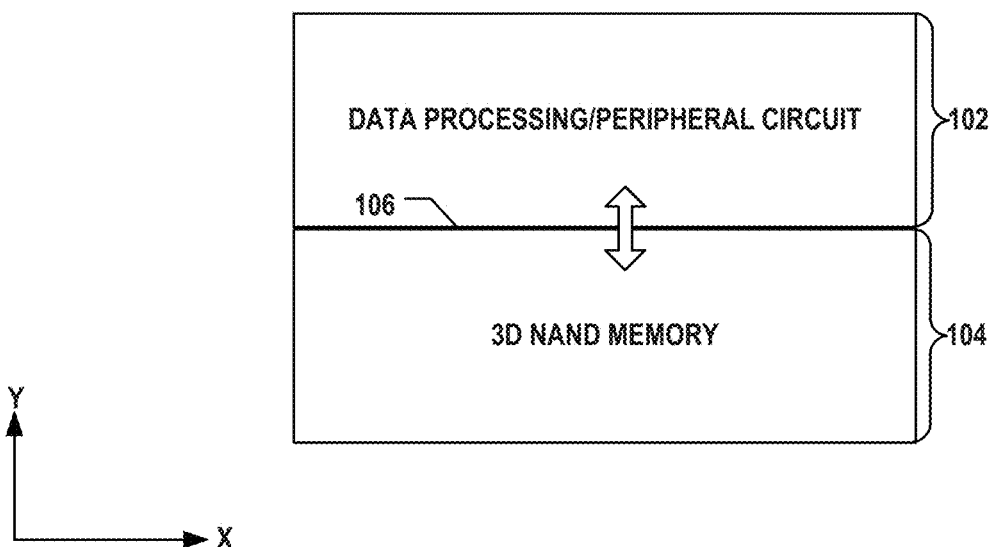
FIG. 1B illustrates a schematic view of a cross-section of another exemplary 3D memory device with a data processing circuit, according to some embodiments.

It is understood that the relative positions of stacked first and second semiconductor structures 102 and 104 are not limited. FIG. 1B illustrates a schematic view of a cross-section of another exemplary 3D memory device 101 with a data processing circuit, according to some embodiments. Different from 3D memory device 100 in FIG. 1A in which the second semiconductor structure 104 including the array of 3D NAND memory strings is above the first semiconductor structure 102 including the peripheral circuits and the data processing circuit, in 3D memory device 100 in FIG. 1B, the first semiconductor structure 102 including the peripheral circuits and the data processing circuit is above the second semiconductor structure 104 including the array of 3D NAND memory strings. Nevertheless, bonding interface 106 is formed vertically between first and second semiconductor structures 102 and 104 in 3D memory device 101. The first and second semiconductor structures 102 and 104 are joined vertically through bonding (e.g., hybrid bonding) according to some embodiments. Data transfer between the array of 3D NAND memory strings in second semiconductor structure 104 and the data processing circuit in first semiconductor structure 102 can be performed through the interconnects (e.g., bonding contacts via hybrid bonding) across bonding interface 106.

Figure 2:
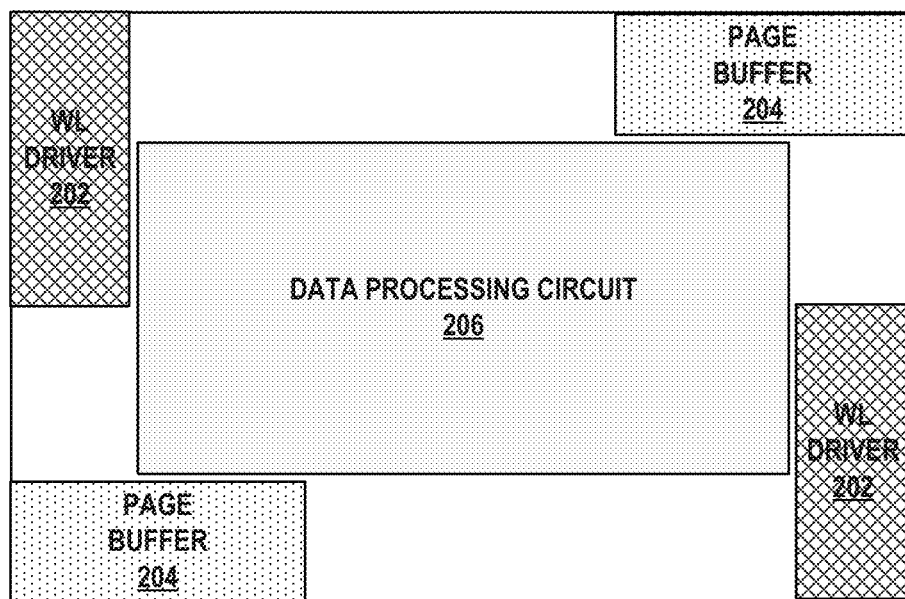
FIG. 2 illustrates a schematic plan view of an exemplary semiconductor structure having a peripheral circuit and a data processing circuit, according to some embodiments.

FIG. 2 illustrates a schematic plan view of an exemplary semiconductor structure 200 having a peripheral circuit and a data processing circuit, according to some embodiments. Semiconductor structure 200 may be one example of first semiconductor structure 102. Semiconductor structure 200 can include peripheral circuits for controlling and sensing a 3D NAND memory, including word line drivers 202, page buffers 204, and any other suitable circuits. Semiconductor structure 200 can further include data processing circuit 206 on the same die as the peripheral circuits and fabricated using the same logic process as the peripheral circuits. FIG. 2 shows an exemplary layout of the peripheral circuits (e.g., word line drivers 202, page buffers 204) and data processing circuit 206 in which peripheral circuits (e.g., word line drivers 202, page buffers 204) and data processing circuit 206 are formed in different regions on the same plane. For example, data processing circuit 206 may be formed outside of the peripheral circuits (e.g., word line drivers 202, page buffers 204). It is understood that the layout of semiconductor structure 200 is not limited to the exemplary layout in FIG. 2. In some embodiments, the peripheral circuit (e.g., word line drivers 202 and page buffers 204) and data processing circuit 206 are formed in non-overlapping regions of the same plane. In some embodiments, on a plane, data processing circuit 206 is formed in space that is not used for the formation of the peripheral circuit. In some embodiments, the peripheral circuit (e.g., word line drivers 202 and page buffers 204) and data processing circuit 206 are stacked one over another, i.e., on different planes. For example, data processing circuit 206 (e.g., an array of logic gates) may be formed above or below the peripheral circuit (e.g., word line drivers 202, page buffers 204) to further reduce the chip size.

Figure 3:
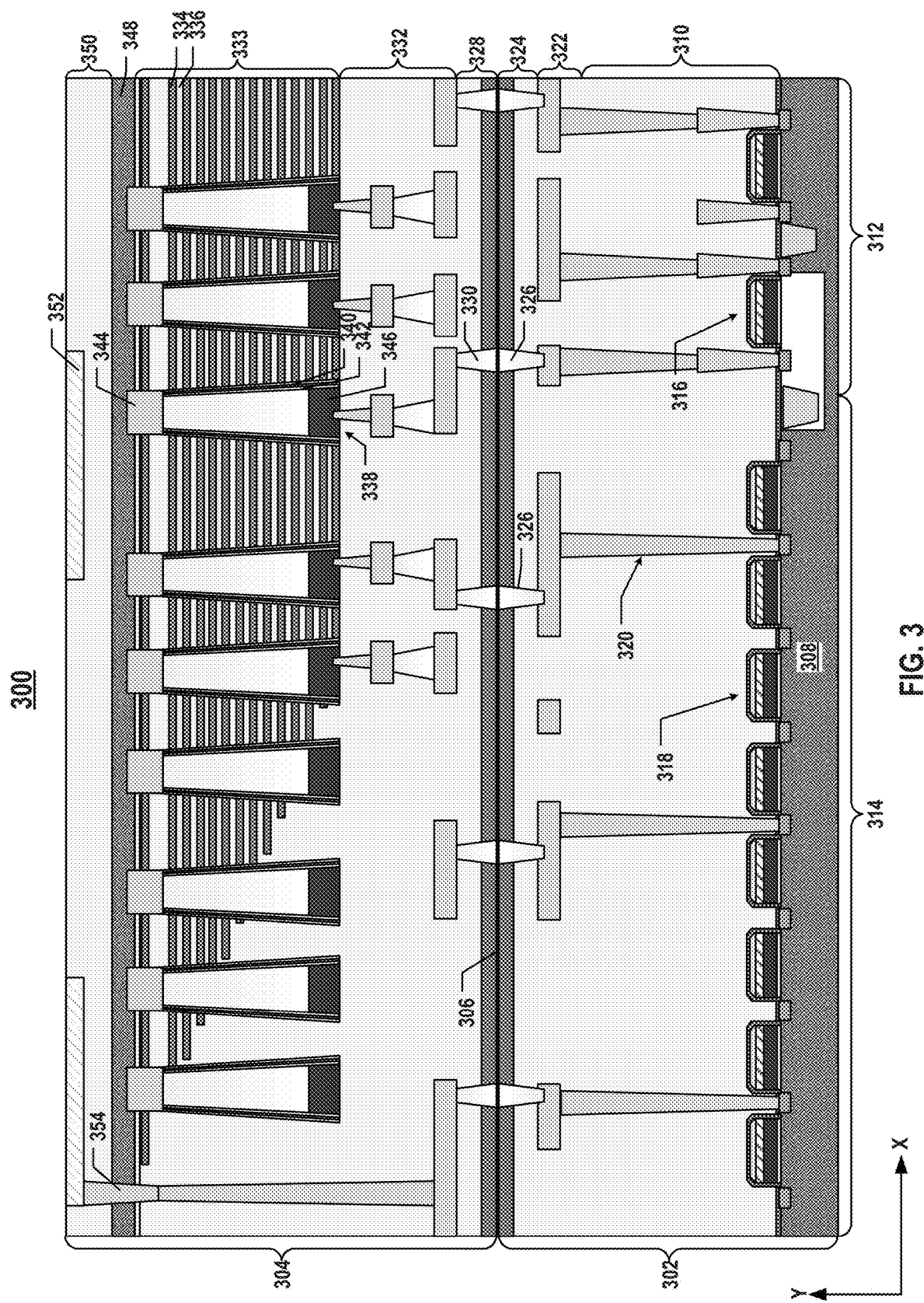
FIG. 3 illustrates a cross-section of an exemplary 3D memory device with a data processing circuit, according to some embodiments.

FIG. 3 illustrates a cross-section of an exemplary 3D memory device 300 with a data processing circuit, according to some embodiments. As one example of 3D memory device 100 described above with respect to FIG. 1A, 3D memory device 300 is a non-monolithic 3D memory device including a first semiconductor structure 302 and a second semiconductor structure 304 stacked over first semiconductor structure 302. First and second semiconductor structures 302 and 304 are joined at a bonding interface 306 therebetween. As shown in FIG. 3, first semiconductor structure 302 can include a substrate 308, which can include silicon (e.g., single crystalline silicon), silicon germanium (SiGe), gallium arsenide (GaAs), germanium (Ge), silicon on insulator (SOD, or any other suitable materials.

First semiconductor structure 302 of 3D memory device 300 can include a device layer 310 above substrate 308. It is noted that x and y axes are added in FIG. 3 to further illustrate the spatial relationship of the components in 3D memory device 300. Substrate 308 includes two lateral surfaces (e.g., a top surface and a bottom surface) extending laterally in the x-direction (the lateral direction or width direction). As used herein, whether one component (e.g., a layer or a device) is "on," "above," or "below" another component (e.g., a layer or a device) of a semiconductor device (e.g., 3D memory device 300) is determined relative to the substrate of the semiconductor device (e.g., substrate 308) in the y-direction (the vertical direction or thickness direction) when the substrate is positioned in the lowest plane of the semiconductor device in the y-direction. The same notion for describing spatial relationship is applied throughout the present disclosure.

In some embodiments, device layer 310 includes a peripheral circuit 312 on substrate 308. Device layer 310 also includes a data processing circuit 314 on substrate 308 and outside of peripheral circuit 312. In some embodiments, peripheral circuit 312 includes a plurality of peripheral transistors 316 forming any suitable digital, analog, and/or mixed-signal peripheral circuits used for facilitating the operation of 3D memory device 300 including, but not limited to, a page buffer, a decoder (e.g., a row decoder and a column decoder), a sense amplifier, a driver, a charge pump, a current or voltage reference. Peripheral transistors 316 can be formed "on" substrate 308, in which the entirety or part of peripheral transistors 316 are formed in substrate 308 (e.g., below the top surface of substrate 308) and/or directly on substrate 308. Isolation regions (e.g., shallow trench isolations (STIs)) and doped regions (e.g., source regions and drain regions of peripheral transistors 316) can be formed in substrate 308 as well.

In some embodiments, data processing circuit 314 includes a plurality of transistors 318 (e.g., MOSFETs). In some embodiments, transistors 318 may form logic gates of a field-programmable gate array (FPGA). In some embodiments, transistors 318 may be part of an application-specific integrated circuit (ASIC), a microcontroller unit (MCU), or other data processing circuits capable of performing computation, data operations, and/or logic operations. In some embodiments, transistors 318 are formed "on" substrate 308, in which the entirety or part of transistors 318 are formed in substrate 308 (e.g., below the top surface of substrate 308) and/or directly on substrate 308. Isolation regions (e.g., shallow trench isolations (STIs)) and doped regions (e.g., source regions and drain regions of transistors 318) can be formed in substrate 308 as well. As shown in FIG. 3, transistors 318 and peripheral transistors 316 can be formed in different regions on the same plane, e.g., on substrate 308. That is, transistors 318 can be formed outside of the region in which peripheral circuit 312 is formed on substrate 308. For ease of illustration, FIG. 3 only depicts a limited number of transistors 318. An electrode contact 320 may connect one or more transistors 318 (e.g., via electrodes of MOSFETs) to a bonding contact 326 to facilitate data communication between data processing circuit 314 and memory arrays in second semiconductor structure 304 through bonding interface 306. It is understood that the configuration in FIG. 3, e.g., the layout of transistors 318 and the connection between transistors 318 and bonding contact 326, do not reflect the actual layout and electrical connection between the transistors and other components.

In some embodiments, first semiconductor structure 302 of 3D memory device 300 further includes an interconnect layer 322 above device layer 310 to transfer electrical signals to and from peripheral circuit 312 and data processing circuit 314. Interconnect layer 322 can include a plurality of interconnects (also referred to herein as "contacts"), including lateral interconnect lines and vertical interconnect access (via) contacts. As used herein, the term "interconnects" can broadly include any suitable types of interconnects, such as middle-end-of-line (MEOL) interconnects and back-end-of-line (BEOL) interconnects. Interconnect layer 322 can further include one or more interlayer dielectric (ILD) layers (also known as "intermetal dielectric (IMD) layers") in which the interconnect lines and via contacts can form. That is, interconnect layer 322 can include interconnect lines and via contacts in multiple ILD layers. The interconnect lines and via contacts in interconnect layer 322 can include conductive materials including, but not limited to, tungsten (W), cobalt (Co), copper (Cu), aluminum (Al), silicides, or any combination thereof. The ILD layers in interconnect layer 322 can include dielectric materials including, but not limited to, silicon oxide, silicon nitride, silicon oxynitride, low dielectric constant (low-k) dielectrics, or any combination thereof.

As shown in FIG. 3, first semiconductor structure 302 of 3D memory device 300 can further include a bonding layer 324 at bonding interface 306 and above interconnect layer 322 and device layer 310 (including peripheral circuit 312 and data processing circuit 314). Bonding layer 324 can include a plurality of bonding contacts 326 and dielectrics electrically isolating bonding contacts 326. Bonding contacts 326 can include conductive materials including, but not limited to, W, Co, Cu, Al, silicides, or any combination thereof. The remaining area of bonding layer 324 can be formed with dielectrics including, but not limited to, silicon oxide, silicon nitride, silicon oxynitride, low-k dielectrics, or any combination thereof. Bonding contacts 326 and surrounding dielectrics in bonding layer 324 can be used for hybrid bonding.

Similarly, as shown in FIG. 3, second semiconductor structure 304 of 3D memory device 300 can also include a bonding layer 328 at bonding interface 306 and above bonding layer 324 of first semiconductor structure 302. Bonding layer 328 can include a plurality of bonding contacts 330 and dielectrics electrically isolating bonding contacts 330. Bonding contacts 330 can include conductive materials including, but not limited to, W, Co, Cu, Al, silicides, or any combination thereof. The remaining area of bonding layer 328 can be formed with dielectrics including, but not limited to, silicon oxide, silicon nitride, silicon oxynitride, low-k dielectrics, or any combination thereof. Bonding contacts 330 and surrounding dielectrics in bonding layer 328 can be used for hybrid bonding.

As described above, second semiconductor structure 304 can be bonded on top of first semiconductor structure 302 in a face-to-face manner at bonding interface 306. In some embodiments, bonding interface 306 is disposed between bonding layers 324 and 328 as a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously. In some embodiments, bonding interface 306 is the place at which bonding layers 324 and 328 are met and bonded. In practice, bonding interface 306 can be a layer with a certain thickness that includes the top surface of bonding layer 324 of first semiconductor structure 302 and the bottom surface of bonding layer 328 of second semiconductor structure 304.

In some embodiments, second semiconductor structure 304 of 3D memory device 300 further includes an interconnect layer 332 above bonding layer 328 to transfer electrical signals. Interconnect layer 332 can include a plurality of interconnects, such as MEOL interconnects and BEOL interconnects. Interconnect layer 332 can further include one or more ILD layers in which the interconnect lines and via contacts can form. The interconnect lines and via contacts in interconnect layer 332 can include conductive materials including, but not limited to, W, Co, Cu, Al, silicides, or any combination thereof. The ILD layers in interconnect layer 332 can include dielectric materials including, but not limited to, silicon oxide, silicon nitride, silicon oxynitride, low-k dielectrics, or any combination thereof.

In some embodiments, second semiconductor structure 304 of 3D memory device 300 includes a NAND Flash memory device in which memory cells are provided in the form of an array of 3D NAND memory strings 338 above interconnect layer 332 and bonding layer 328. Each 3D NAND memory string 338 extends vertically through a plurality of pairs each including a conductor layer 334 and a dielectric layer 336, according to some embodiments. The stacked and interleaved conductor layers 334 and dielectric layer 336 are also referred to herein as a memory stack 333. Interleaved conductor layers 334 and dielectric layers 336 in memory stack 333 alternate in the vertical direction, according to some embodiments. In other words, except for the ones at the top or bottom of memory stack 333, each conductor layer 334 can be adjoined by two dielectric layers 336 on both sides, and each dielectric layer 336 can be adjoined by two conductor layers 334 on both sides. Conductor layers 334 can each have the same thickness or different thicknesses. Similarly, dielectric layers 336 can each have the same thickness or different thicknesses. Conductor layers 334 can include conductor materials including, but not limited to, W, Co, Cu, Al, doped silicon, silicides, or any combination thereof. Dielectric layers 336 can include dielectric materials including, but not limited to, silicon oxide, silicon nitride, silicon oxynitride, or any combination thereof.

In some embodiments, each 3D NAND memory string 338 is a "charge trap" type of NAND memory string including a semiconductor channel 342 and a memory film 340. In some embodiments, semiconductor channel 342 includes silicon, such as amorphous silicon, polysilicon, or single crystalline silicon. In some embodiments, memory film 340 is a composite dielectric layer including a tunneling layer, a storage layer (also known as "charge trap/storage layer"), and a blocking layer. Each 3D NAND memory string 338 can have a cylinder shape (e.g., a pillar shape). Semiconductor channel 342, the tunneling layer, the storage layer, and the blocking layer of memory film 340 are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, the blocking layer can include a composite layer of silicon oxide/silicon oxynitride/silicon oxide (ONO). In another example, the blocking layer can include a high-k dielectric layer, such as an aluminum oxide ($Al_2O_3$) layer, a hafnium oxide ($HfO_2$) layer, a tantalum oxide ($Ta_2O_5$) layer, etc.

In some embodiments, 3D NAND memory strings 338 further include a plurality of control gates (each being part of a word line). Each conductor layer 334 in memory stack 333 can act as a control gate for each memory cell of 3D NAND memory string 338. In some embodiments, each 3D NAND memory string 338 includes two plugs 344 and 346 at a respective end in the vertical direction. Plug 344 can include a semiconductor material, such as single-crystal silicon, that is epitaxially grown from a semiconductor layer 348. Plug 344 can function as the channel controlled by a source select gate of 3D NAND memory string 338. Plug 344 can be at the upper end of 3D NAND memory string 338 and in contact with semiconductor channel 342. As used herein, the "upper end" of a component (e.g., 3D NAND memory string 338) is the end father away from substrate 308 in the y-direction, and the "lower end" of the component (e.g., 3D NAND memory string 338) is the end closer to substrate 308 in the y-direction when substrate 308 is positioned in the lowest plane of 3D memory device 300. Another Plug 346 can include semiconductor materials (e.g., polysilicon) or conductor materials (e.g., metals). In some embodiments, plug 346 includes an opening filled with titanium/titanium nitride (Ti/TiN as a barrier layer) and tungsten (as a conductor). By covering the upper end of 3D NAND memory string 338 during the fabrication of 3D memory device 300, plug 346 can function as an etch stop layer to prevent etching of dielectrics filled in 3D NAND memory string 338, such as silicon oxide and silicon nitride. In some embodiments, plug 346 functions as the drain of 3D NAND memory string 338.

In some embodiments, second semiconductor structure 304 further includes semiconductor layer 348 disposed above memory stack 333 and 3D NAND memory strings 338. Semiconductor layer 348 can be a thinned substrate on which memory stack 333 and 3D NAND memory strings 338 are formed. In some embodiments, semiconductor layer 348 includes single-crystal silicon from which plugs 344 can be epitaxially grown. In some embodiments, semiconductor layer 348 can include polysilicon, amorphous silicon, SiGe, GaAs, Ge, or any other suitable materials. Semiconductor layer 348 can also include isolation regions and doped regions (e.g., functioning as an array common source for 3D NAND memory strings 338, not shown). Isolation regions (not shown) can extend across the entire thickness or part of the thickness of semiconductor layer 348 to electrically isolate the doped regions. In some embodiments, a pad oxide layer including silicon oxide is disposed between memory stack 333 and semiconductor layer 348.

It is understood that 3D NAND memory strings 338 are not limited to the "charge trap" type of 3D NAND memory strings and may be "floating gate" type of 3D NAND memory strings in other embodiments. Semiconductor layer 348 may include polysilicon as the source plate of the "floating gate" type of 3D NAND memory strings.

As shown in FIG. 3, second semiconductor structure 304 of 3D memory device 300 can further include a pad-out interconnect layer 350 above semiconductor layer 348. Pad-out interconnect layer 350 include interconnects, e.g., contact pads 352, in one or more ILD layers. The pad-out interconnect layer 350 and interconnect layer 332 can be formed at opposite sides of semiconductor layer 348. In some embodiments, the interconnects in pad-out interconnect layer 350 can transfer electrical signals between 3D memory device 300 and outside circuits, e.g., for pad-out purposes.

In some embodiments, second semiconductor structure 304 further includes one or more contacts 354 extending through semiconductor layer 348 to electrically connect pad-out interconnect layer 350 and interconnect layers 332 and 322. As a result, data processing circuit 314 can be electrically connected to array of 3D NAND memory strings 338 through interconnect layers 322 and 332 as well as bonding contacts 326 and 330. Moreover, peripheral circuit 312, data processing circuit 314, and array of 3D NAND memory strings 338 can be electrically connected to outside circuits through contacts 354 and pad-out interconnect layer 350.

Figure 4:
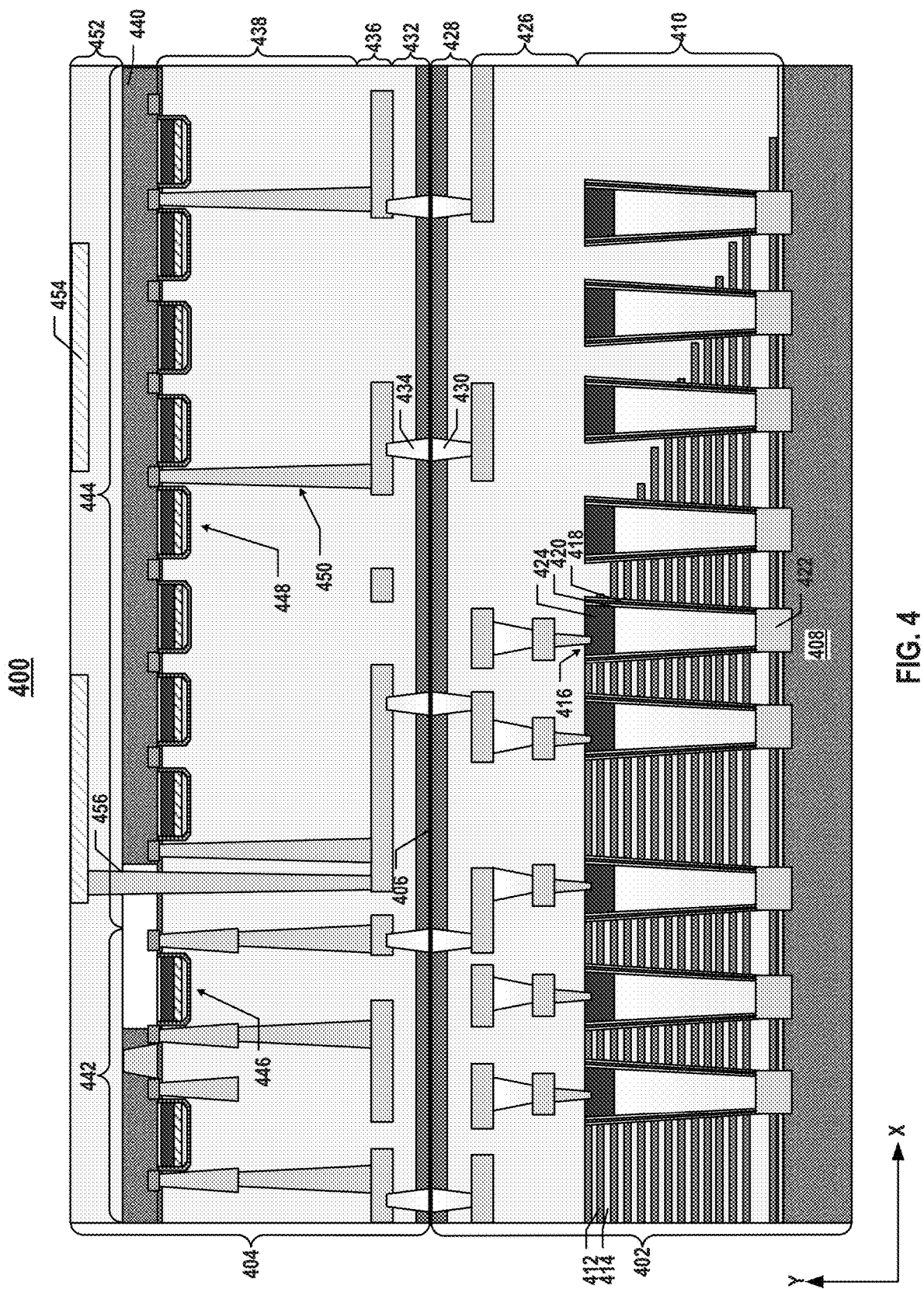
FIG. 4 illustrates a cross-section of another exemplary 3D memory device with a data processing circuit, according to some embodiments.

FIG. 4 illustrates a cross-section of another exemplary 3D memory device 400 with a data processing circuit, according to some embodiments. Similar to 3D memory device 300 described above in FIG. 3, 3D memory device 400 represents an example of a non-monolithic 3D memory device in which a first semiconductor structure 402 including 3D NAND memory strings and a second semiconductor structure 404 including peripheral circuits and data processing circuit(s) are formed separately and bonded in a face-to-face manner at a bonding interface 406. Different from 3D memory device 300 described above in FIG. 3 in which first semiconductor structure 302 including peripheral circuits and data processing circuit(s) is below second semiconductor structure 304 including 3D NAND memory strings, 3D memory device 400 in FIG. 4 includes second semiconductor structure 404 including peripheral circuits and data processing circuit(s) disposed above first semiconductor structure 402 including 3D NAND memory strings. It is understood that the details of similar structures (e.g., materials, fabrication process, functions, etc.) in both 3D memory devices 300 and 400 may not be repeated below.

First semiconductor structure 402 of 3D memory device 400 can include a substrate 408 and a memory stack 410 including interleaved conductor layers 412 and dielectric layers 414 above substrate 408. In some embodiments, an array of 3D NAND memory strings 416 each extends vertically through interleaved conductor layers 412 and dielectric layers 414 in memory stack 410 above substrate 408. Each 3D NAND memory string 416 can include a semiconductor channel 420 and a memory film 418. Each 3D NAND memory string 416 further includes two plugs 422 and 424 at its lower end and upper end, respectively. 3D NAND memory strings 416 can be "charge trap" type of 3D NAND memory strings or "floating gate" type of 3D NAND memory strings. In some embodiments, a pad oxide layer including silicon oxide is disposed between memory stack 410 and substrate 408.

In some embodiments, first semiconductor structure 402 of 3D memory device 400 also includes an interconnect layer 426 above memory stack 410 and 3D NAND memory strings 416 to transfer electrical signals to and from 3D NAND memory strings 416. Interconnect layer 426 can include a plurality of interconnects, including interconnect lines and via contacts. In some embodiments, the interconnects in interconnect layer 426 also include local interconnects, such as bit line contacts and word line contacts. In some embodiments, first semiconductor structure 402 of 3D memory device 400 further includes a bonding layer 428 at bonding interface 406 and above interconnect layer 426 and memory stack 410. Bonding layer 428 can include a plurality of bonding contacts 430 and dielectrics surrounding and electrically isolating bonding contacts 430.

As shown in FIG. 4, second semiconductor structure 404 of 3D memory device 400 includes another bonding layer 432 at bonding interface 406 and above bonding layer 428. Bonding layer 432 can include a plurality of bonding contacts 434 and dielectrics surrounding and electrically isolating bonding contacts 434. In some embodiments, second semiconductor structure 404 of 3D memory device 400 also includes an interconnect layer 436 above bonding layer 432 to transfer electrical signals. Interconnect layer 436 can include a plurality of interconnects, including interconnect lines and via contacts.

Second semiconductor structure 404 of 3D memory device 400 can further include a device layer 438 above interconnect layer 436 and bonding layer 432. In some embodiments, device layer 438 includes a peripheral circuit 442 above interconnect layer 436 and bonding layer 432 and a data processing circuit 444 above interconnect layer 436 and bonding layer 432 and outside of peripheral circuit 442. In some embodiments, peripheral circuit 442 includes a plurality of peripheral transistors 446 forming any suitable digital, analog, and/or mixed-signal peripheral circuits used for facilitating the operation of 3D memory device 400 including, but not limited to, a page buffer, a decoder (e.g., a row decoder and a column decoder), a sense amplifier, a driver, a charge pump, a current or voltage reference. Peripheral transistors 446 can be formed "on" a semiconductor layer 440, in which the entirety or part of peripheral transistors 446 are formed in semiconductor layer 440 and/or directly on semiconductor layer 440. Isolation regions (e.g., shallow trench isolations (STIs)) and doped regions (e.g., source regions and drain regions of peripheral transistors 446) can be formed in semiconductor layer 440 as well.

In some embodiments, data processing circuit 444 includes a plurality of transistors 448 (e.g., MOSFETs). In some embodiments, transistors 448 may form logic gates of an FPGA. In some embodiments, transistors 448 may be part of an ASIC, an MCU, or other data processing circuits capable of performing computation, data operations, and/or logic operations. In some embodiments, transistors 448 are formed "on" semiconductor layer 440, in which the entirety or part of transistors 448 are formed in semiconductor layer 440 and/or directly on semiconductor layer 440. Isolation regions (e.g., shallow trench isolations (STIs)) and doped regions (e.g., source regions and drain regions of transistors 448) can be formed in semiconductor layer 440 as well. As shown in FIG. 4, transistors 448 and peripheral transistors 446 can be formed in different regions on the same plane, e.g., on semiconductor layer 440. That is, transistors 448 can be formed outside of the region in which peripheral circuit 442 is formed on semiconductor layer 440. For ease of illustration, FIG. 4 only depicts a limited number of transistors 448. An electrode contact 450 may connect one or more transistors 448 (e.g., via electrodes of MOSFETs) to bonding contact 434 to facilitate data communication between data processing circuit 444 and memory arrays in first semiconductor structure 402 through bonding interface 406. It is understood that the configuration in FIG. 4, e.g., the layout of transistors and the connection between transistors 448 and bonding contact 434, do not reflect the actual layout and electrical connection between the transistors and other components.

In some embodiments, second semiconductor structure 404 further includes semiconductor layer 440 disposed above device layer 438. Semiconductor layer 440 can be a thinned substrate on which peripheral transistors 446 and transistors 448 are formed. In some embodiments, semiconductor layer 440 includes single-crystal silicon. In some embodiments, semiconductor layer 440 can include polysilicon, amorphous silicon, SiGe, GaAs, Ge, or any other suitable materials. Semiconductor layer 440 can also include isolation regions and doped regions.

As shown in FIG. 4, second semiconductor structure 404 of 3D memory device 400 can further include a pad-out interconnect layer 452 above semiconductor layer 440. Pad-out interconnect layer 452 include interconnects, e.g., contact pads 454, in one or more ILD layers. In some embodiments, the interconnects in pad-out interconnect layer 452 can transfer electrical signals between 3D memory device 400 and outside circuits, e.g., for pad-out purposes. In some embodiments, second semiconductor structure 404 further includes one or more contacts 456 extending through semiconductor layer 440 to electrically connect pad-out interconnect layer 452 and interconnect layers 436 and 426. As a result, data processing circuit 444 can be electrically connected to array of 3D NAND memory strings 416 through interconnect layers 426 and 436 as well as bonding contacts 430 and 434. Moreover, peripheral circuit 442, data processing circuit 444, and array of 3D NAND memory strings 416 can be electrically connected to outside circuits through contacts 456 and pad-out interconnect layer 452.

Figure 5A:
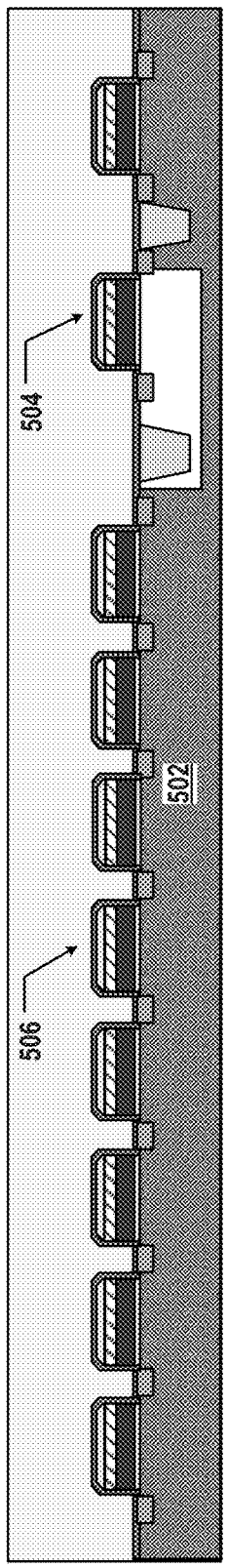
FIGS. 5A-5C illustrate a fabrication process for forming an exemplary semiconductor structure having a peripheral circuit and a data processing circuit, according to some embodiments.
Figure 5B:
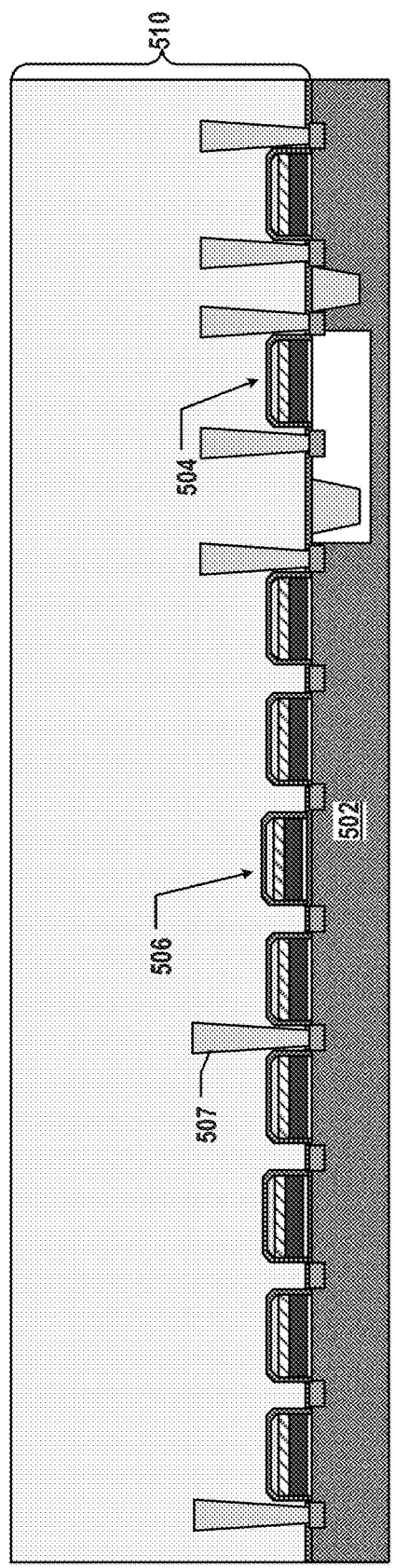
Figure 5C:
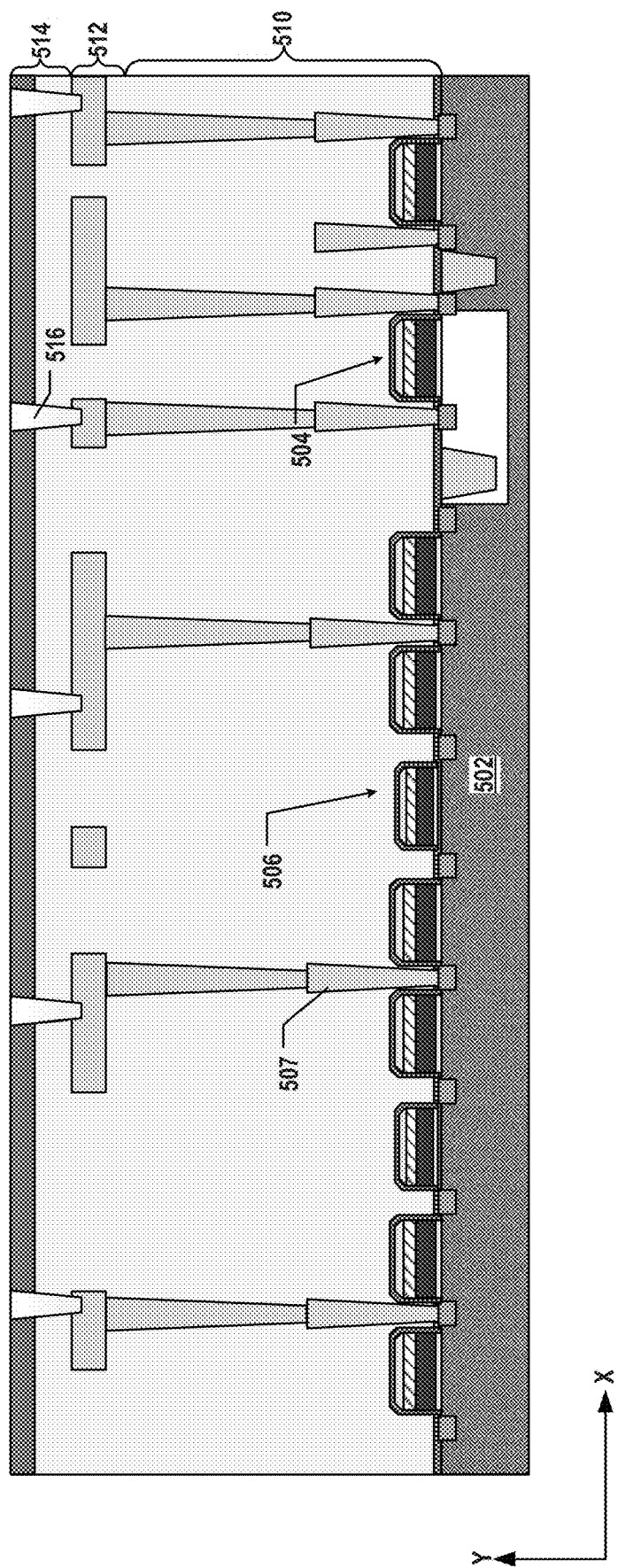
Figure 6A:
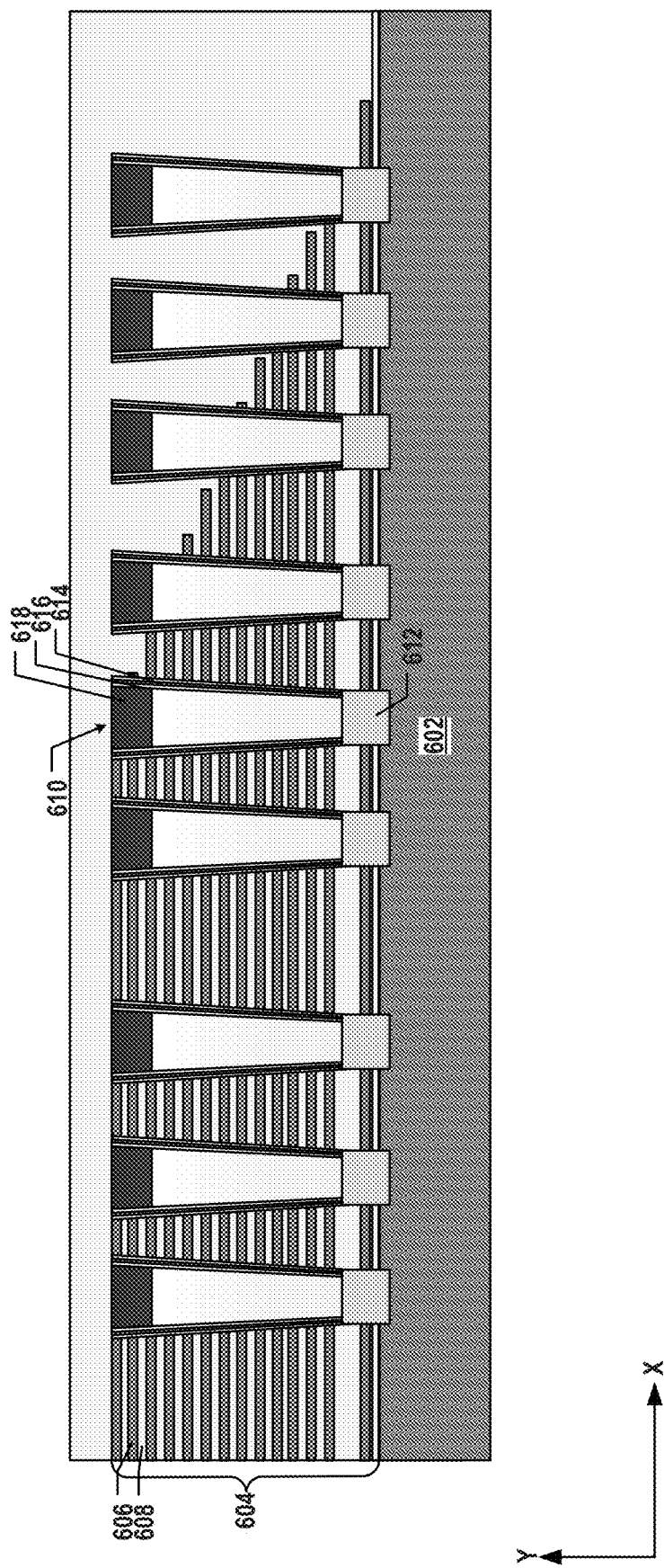
FIGS. 6A and 6B illustrate a fabrication process for forming an exemplary semiconductor structure having 3D NAND memory strings, according to some embodiments.
Figure 6B:
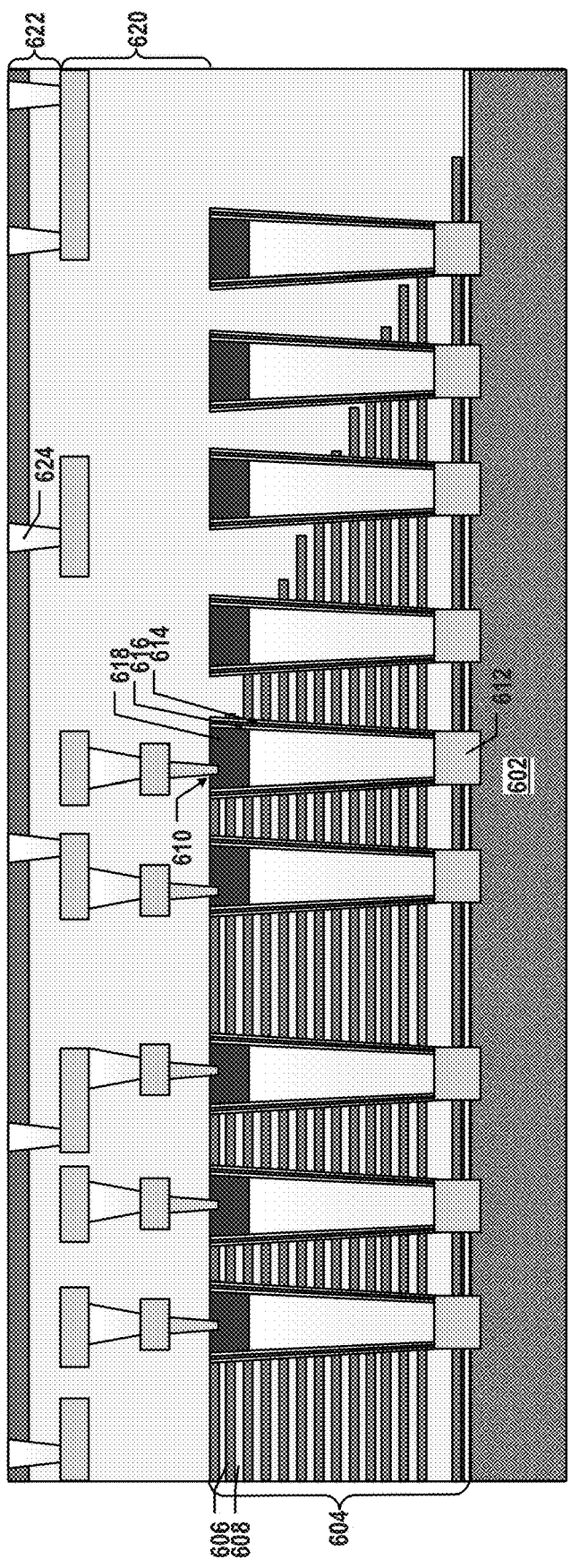
Figure 7A:
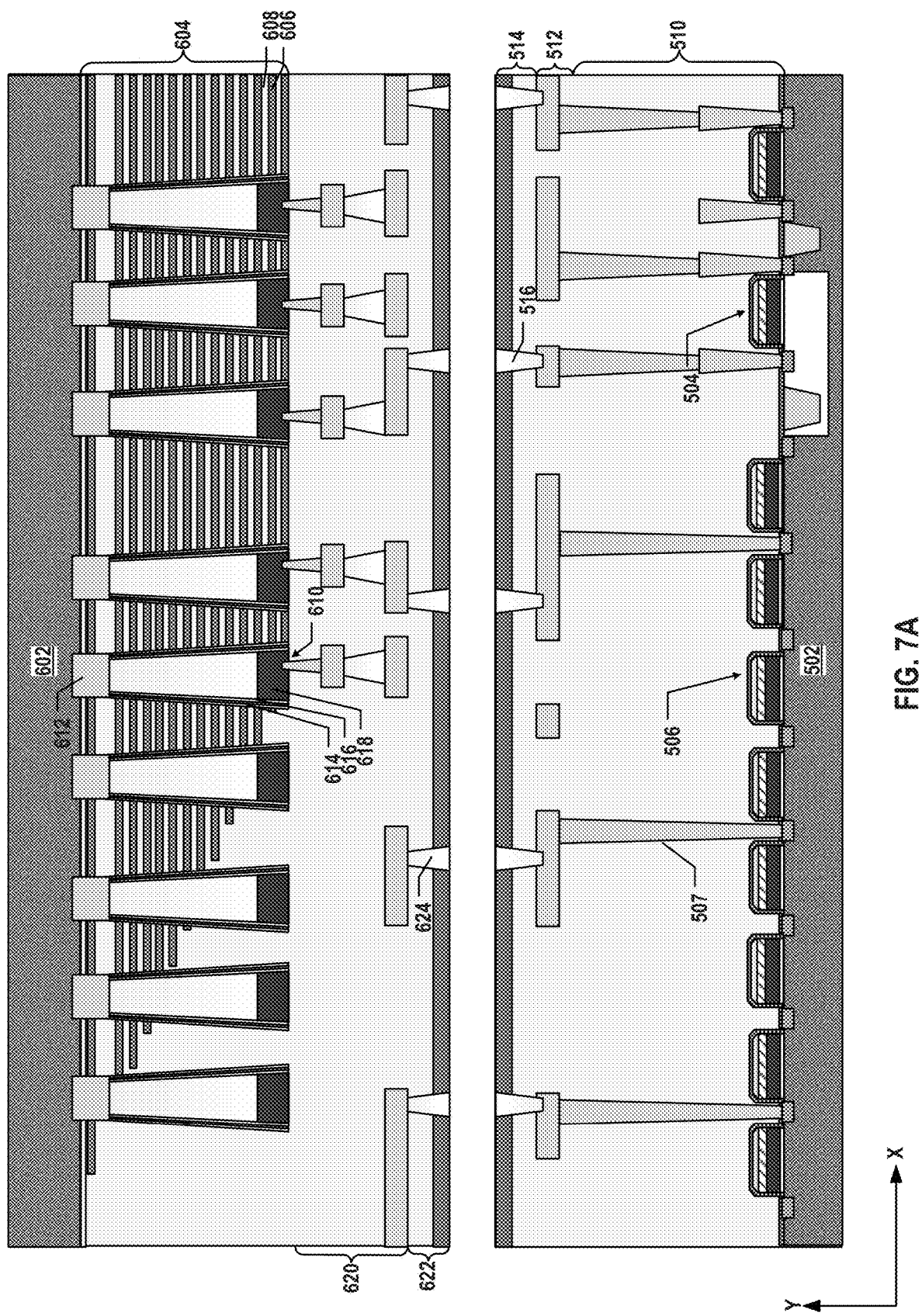
FIGS. 7A and 7B illustrate a fabrication process for forming an exemplary 3D memory device with a data processing circuit, according to some embodiments.
Figure 7B:
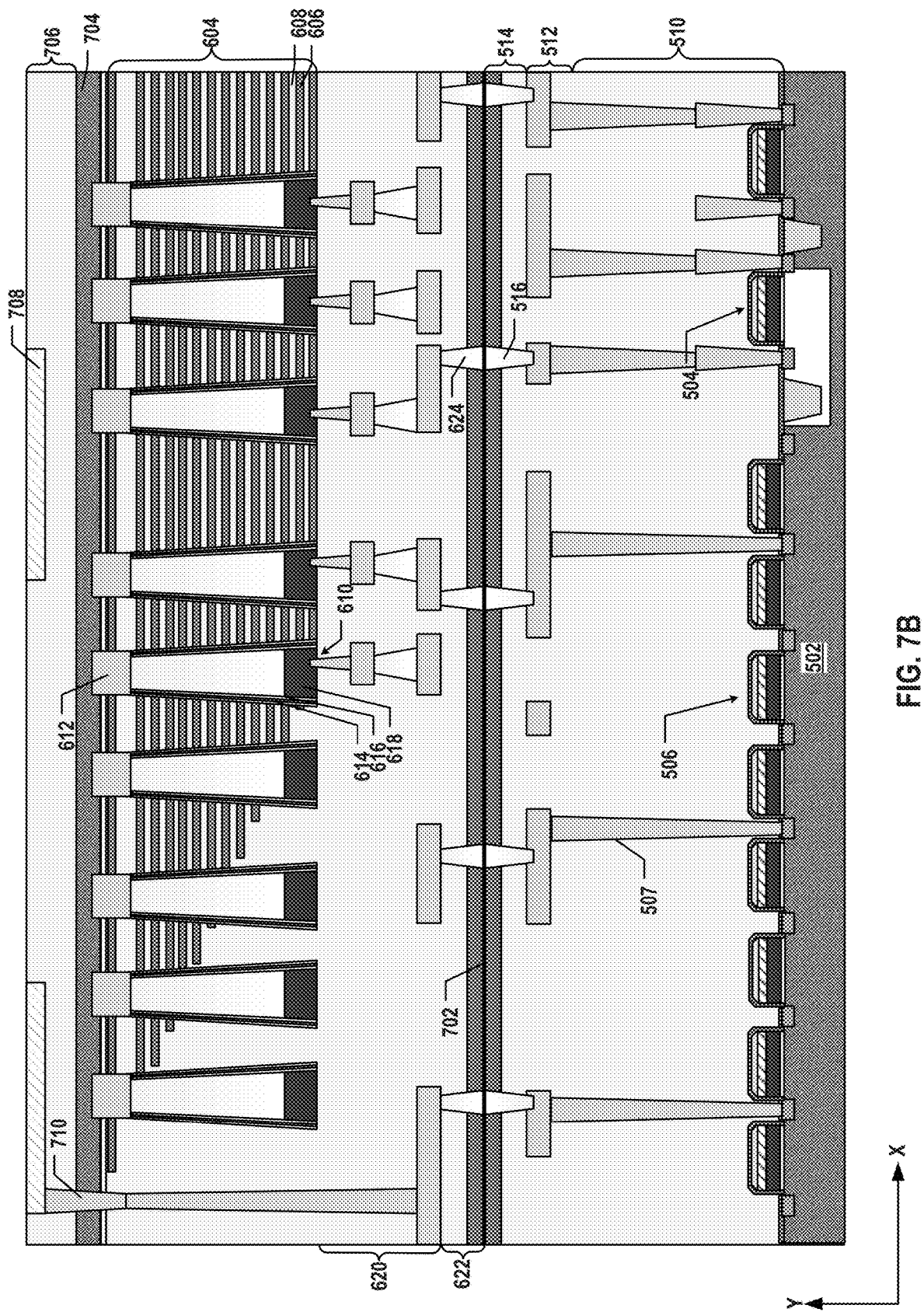
Figure 11:
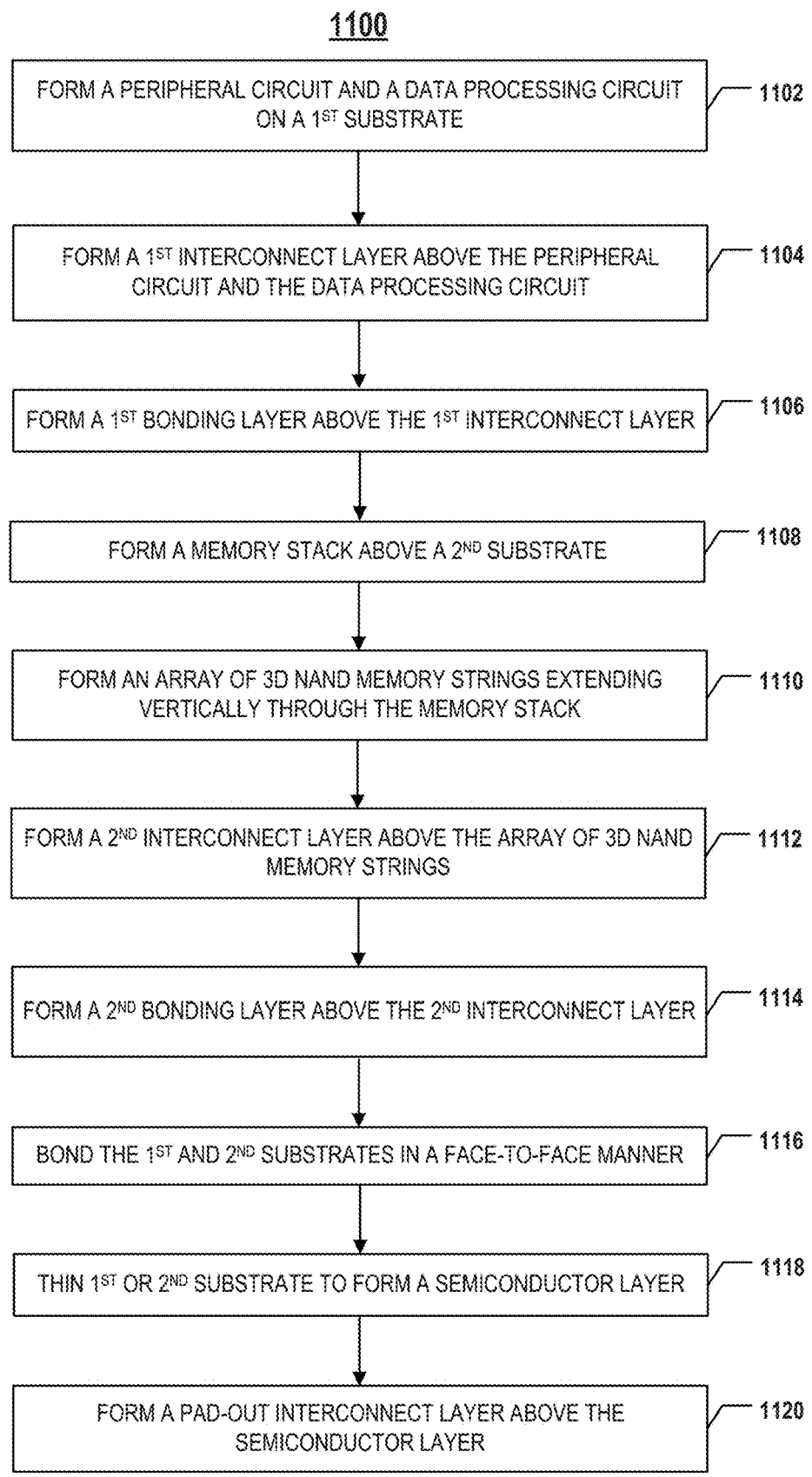
FIG. 11 is a flowchart of an exemplary method for forming a 3D memory device with a data processing circuit, according to some embodiments.

FIGS. 5A-5C illustrate a fabrication process for forming an exemplary semiconductor structure having a peripheral circuit and a data processing circuit, according to some embodiments. FIGS. 6A and 6B illustrate a fabrication process for forming an exemplary semiconductor structure having 3D NAND memory strings, according to some embodiments. FIGS. 7A and 7B illustrate a fabrication process for forming an exemplary 3D memory device with a data processing circuit, according to some embodiments. FIG. 11 is a flowchart of an exemplary method 1100 for forming a 3D memory device with a data processing circuit, according to some embodiments. Examples of the 3D memory device depicted in FIGS. 5A-5C, 6A-6B, 7A-7B, and 11 include 3D memory device 300 depicted in FIG. 3 and 3D memory device 400 depicted in FIG. 4. FIGS. 5A-5C, 6A-6B, 7A-7B, and 11 will be described together. It is understood that the operations shown in method 1100 are not exhaustive and that other operations can be performed as well before, after, or between any of the illustrated operations. Further, some of the operations may be performed simultaneously, or in a different order than shown in FIG. 11.

As depicted in FIGS. 5A-5C, a first semiconductor structure including a peripheral circuit, a data processing circuit, and a first bonding layer including a plurality of first bonding contacts is formed. As depicted in FIGS. 6A and 6B, a second semiconductor structure including an array of 3D NAND memory strings and a second bonding layer including a plurality of second bonding contacts is formed. As depicted in FIGS. 7A and 7B, the first semiconductor structure and the second semiconductor structure are bonded in a face-to-face manner, such that the first bonding contacts are in contact with the second bonding contacts at a bonding interface.

Referring to FIG. 11, method 1100 starts at operation 1102, in which the peripheral circuit and the data processing circuit are formed on a first substrate. The first substrate can be a silicon substrate. In some embodiments, to form the peripheral circuit and the data processing circuit, a plurality of transistors are formed on the first substrate. As illustrated in FIG. 5A, a plurality of transistors (e.g., peripheral transistors 504 and logic transistors 506 for forming the data processing circuit) are formed on a silicon substrate 502. Transistors 504 and 506 can be formed by a plurality of processes including, but not limited to, photolithography, dry/wet etch, thin film deposition, thermal growth, implantation, chemical mechanical polishing (CMP), and any other suitable processes. In some embodiments, doped regions are formed in silicon substrate 502 by ion implantation and/or thermal diffusion, which function, for example, as source regions and/or drain regions of transistors 504 and 506. In some embodiments, isolation regions (e.g., STIs) are also formed in silicon substrate 502 by wet/dry etch and thin film deposition.

As illustrated in FIG. 5B, electrode contacts 507 are formed as well for connecting logic transistors 506. A device layer 510 including a peripheral circuit (having peripheral transistors 504) and a data processing circuit (having logic transistors 506) are thereby formed.

Method 1100 proceeds to operation 1104, as illustrated in FIG. 11, in which a first interconnect layer is formed above the peripheral circuit and the data processing circuit. The first interconnect layer can include a first plurality of interconnects in one or more ILD layers. As illustrated in FIG. 5C, an interconnect layer 512 can be formed above device layer 510 including the peripheral circuit (having peripheral transistors 504) and the data processing circuit (having logic transistors 506). Interconnect layer 512 can include interconnects of MEOL and/or BEOL in a plurality of ILD layers to make electrical connections with device layer 510. In some embodiments, interconnect layer 512 includes multiple ILD layers and interconnects therein formed in multiple processes. For example, the interconnects in interconnect layers 512 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 5C can be collectively referred to as interconnect layer 512.

Method 1100 proceeds to operation 1106, as illustrated in FIG. 11, in which a first bonding layer is formed above the first interconnect layer. The first bonding layer can include a plurality of first bonding contacts. As illustrated in FIG. 5C, a bonding layer 514 is formed above interconnect layer 512. Bonding layer 514 can include a plurality of bonding contacts 516 surrounded by dielectrics. In some embodiments, a dielectric layer is deposited on the top surface of interconnect layer 512 by one or more thin film deposition processes including, but not limited to, CVD, PVD, ALD, or any combination thereof. Bonding contacts 516 then can be formed through the dielectric layer and in contact with the interconnects in interconnect layer 512 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1100 proceeds to operation 1108, as illustrated in FIG. 11, in which a memory stack is formed above a second substrate. The second substrate can be a silicon substrate. As illustrated in FIG. 6A, interleaved sacrificial layers (not shown) and dielectric layers 608 are formed above a silicon substrate 602. The interleaved sacrificial layers and dielectric layers 608 can form a dielectric stack (not shown). In some embodiments, each sacrificial layer includes a layer of silicon nitride, and each dielectric layer 608 includes a layer of silicon oxide. The interleaved sacrificial layers and dielectric layers 608 can be formed by one or more thin film deposition processes including, but not limited to, CVD, PVD, ALD, or any combination thereof. In some embodiments, a memory stack 604 can be formed by a gate replacement process, e.g., replacing the sacrificial layers with conductor layers 606 using wet/dry etch of the sacrificial layers selective to dielectric layers 608 and filling the resulting recesses with conductor layers 606. As a result, memory stack 604 can include interleaved conductor layers 606 and dielectric layers 608. In some embodiments, each conductor layer 606 includes a metal layer, such as a layer of tungsten. It is understood that memory stack 604 may be formed by alternatingly depositing conductor layers (e.g., doped polysilicon layers) and dielectric layers (e.g., silicon oxide layers) without the gate replacement process in other embodiments. In some embodiments, a pad oxide layer including silicon oxide is formed between memory stack 604 and silicon substrate 602.

Method 1100 proceeds to operation 1110, as illustrated in FIG. 11, in which the array of 3D NAND memory strings extending vertically through the memory stack are formed. As illustrated in FIG. 6A, 3D NAND memory strings 610 are formed above silicon substrate 602, each of which extends vertically through interleaved conductor layers 606 and dielectric layers 608 of memory stack 604. In some embodiments, fabrication processes to form 3D NAND memory string 610 include forming a channel hole through memory stack 604 and into silicon substrate 602 using dry etching/and or wet etching, such as deep reactive-ion etching (DRIE), followed by epitaxially growing a plug 612 in the lower portion of the channel hole from silicon substrate 602. In some embodiments, fabrication processes to form 3D NAND memory string 610 also include subsequently filling the channel hole with a plurality of layers, such as a memory film 614 (e.g., a tunneling layer, a storage layer, and a blocking layer) and a semiconductor layer 616, using thin film deposition processes such as ALD, CVD, PVD, or any combination thereof. In some embodiments, fabrication processes to form 3D NAND memory string 610 further include forming another plug 618 in the upper portion of the channel hole by etching a recess at the upper end of 3D NAND memory string 610, followed by filling the recess with a semiconductor material using thin film deposition processes such as ALD, CVD, PVD, or any combination thereof.

Method 1100 proceeds to operation 1112, as illustrated in FIG. 11, in which a second interconnect layer is formed above the array of 3D NAND memory strings. The second interconnect layer can include a second plurality of interconnects in one or more ILD layers. As illustrated in FIG. 6B, an interconnect layer 620 can be formed above memory stack 604 and array of 3D NAND memory strings 610. Interconnect layer 620 can include interconnects of MEOL and/or BEOL in a plurality of ILD layers to make electrical connections with 3D NAND memory strings 610. In some embodiments, interconnect layer 620 includes multiple ILD layers and interconnects therein formed in multiple processes. For example, the interconnects in interconnect layers 620 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited by one or more thin film deposition processes including, but not limited to, CVD, PVD, ALD, or any combination thereof. The ILD layers and interconnects illustrated in FIG. 6B can be collectively referred to as interconnect layer 620.

Method 1100 proceeds to operation 1114, as illustrated in FIG. 11, in which a second bonding layer is formed above the second interconnect layer. The second bonding layer can include a plurality of second bonding contacts. As illustrated in FIG. 6B, a bonding layer 622 is formed above interconnect layer 620. Bonding layer 622 can include a plurality of bonding contacts 624 surrounded by dielectrics. In some embodiments, a dielectric layer is deposited on the top surface of interconnect layer 620 by one or more thin film deposition processes including, but not limited to, CVD, PVD, ALD, or any combination thereof. Bonding contacts 624 then can be formed through the dielectric layer and in contact with the interconnects in interconnect layer 620 by first patterning contact holes through the dielectric layer using patterning process (e.g., photolithography and dry/wet etch of dielectric materials in the dielectric layer). The contact holes can be filled with a conductor (e.g., copper). In some embodiments, filling the contact holes includes depositing a barrier layer, an adhesion layer, and/or a seed layer before depositing the conductor.

Method 1100 proceeds to operation 1116, as illustrated in FIG. 11, in which the first substrate and the second substrate are bonded in a face-to-face manner, such that the first bonding contacts are in contact with the second bonding contacts at the bonding interface. The bonding can be hybrid bonding. In some embodiments, the first substrate on which the peripheral circuit and the data processing circuit are formed (e.g., the first semiconductor structure) is disposed above the second substrate on which the 3D NAND memory strings are formed (e.g., the second semiconductor structure) after the bonding. In some embodiments, the second substrate on which the 3D NAND memory strings are formed (e.g., the second semiconductor structure) is disposed above the first substrate on which the peripheral circuit and the data processing circuit are formed (e.g., the first semiconductor structure) after the bonding.

As illustrated in FIG. 7A, silicon substrate 602 and components formed thereon (e.g., 3D NAND memory strings 610) are flipped upside down. Bonding layer 622 facing down is bonded with bonding layer 514 facing up, i.e., in a face-to-face manner, thereby forming a bonding interface 702 (as shown in FIG. 7B). In some embodiments, a treatment process, e.g., a plasma treatment, a wet treatment, and/or a thermal treatment, is applied to the bonding surfaces prior to the bonding. Although not shown in FIG. 7A, silicon substrate 502 and components formed thereon (e.g., device layer 510) can be flipped upside down, and bonding layer 514 facing down can be bonded with bonding layer 622 facing up, i.e., in a face-to-face manner, thereby forming bonding interface 702. After the bonding, bonding contacts 624 in bonding layer 622 and bonding contacts 516 in bonding layer 514 are aligned and in contact with one another, such that device layer 510 (e.g., the peripheral circuit and the data processing circuit therein) can be electrically connected to 3D NAND memory strings 610. It is understood that in the bonded device, 3D NAND memory strings 610 may be either above or below device layer 510 (e.g., the peripheral circuit and the data processing circuit therein). Nevertheless, bonding interface 702 can be formed between 3D NAND memory strings 610 and device layer 510 (e.g., the peripheral circuit and the data processing circuit therein) after the bonding as illustrated in FIG. 7B.

Method 1100 proceeds to operation 1118, as illustrated in FIG. 11, in which the first substrate or the second substrate is thinned to form a semiconductor layer. In some embodiments, the first substrate of the first semiconductor structure, which is above the second substrate of the second semiconductor structure after the bonding, is thinned to form the semiconductor layer. In some embodiments, the second substrate of the second semiconductor structure, which is above the first substrate of the first semiconductor structure after the bonding, is thinned to form the semiconductor layer.

As illustrated in FIG. 7B, the substrate on top of the bonded 3D memory device (e.g., silicon substrate 402 as shown in FIG. 7A) is thinned, so that the thinned top substrate can serve as a semiconductor layer 704, for example, a single-crystal silicon layer. The thickness of the thinned substrate can be between about 200 nm and about 5 μm, such as between 200 nm and 5 μm, or between about 150 nm and about 50 μm, such as between 150 nm and 50 μm. Silicon substrate 402 can be thinned by processes including, but not limited to, wafer grinding, dry etch, wet etch, CMP, any other suitable processes, or any combination thereof. It is understood that when silicon substrate 502 is the substrate on top of the bonded 3D memory device, another semiconductor layer may be formed by thinning silicon substrate 502.

Method 1100 proceeds to operation 1120, as illustrated in FIG. 11, in which a pad-out interconnect layer is formed above the semiconductor layer. As illustrated in FIG. 7B, a pad-out interconnect layer 706 is formed above semiconductor layer 704 (the thinned top substrate). Pad-out interconnect layer 706 can include interconnects, such as pad contacts 708, formed in one or more ILD layers. Pad contacts 708 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some embodiments, after the bonding and thinning, contacts 710 are formed extending vertically through semiconductor layer 704, for example by wet/dry etch followed by depositing conductive materials. Contacts 710 can be in contact with the interconnects in pad-out interconnect layer 706.

Figure 8:
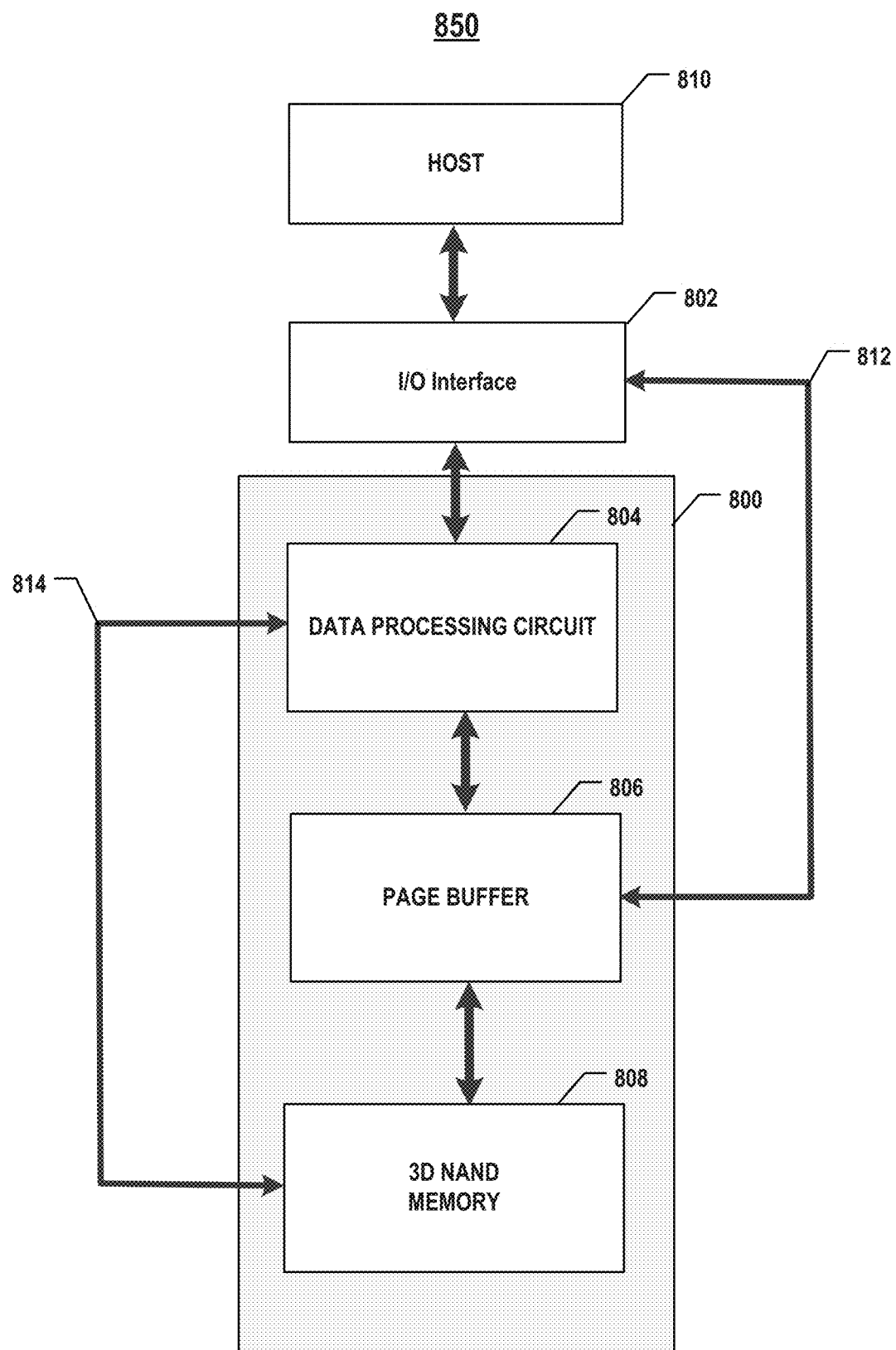
FIG. 8 illustrates a schematic block diagram of an exemplary system having a 3D memory device with a data processing circuit, according to some embodiments.
Figure 9:
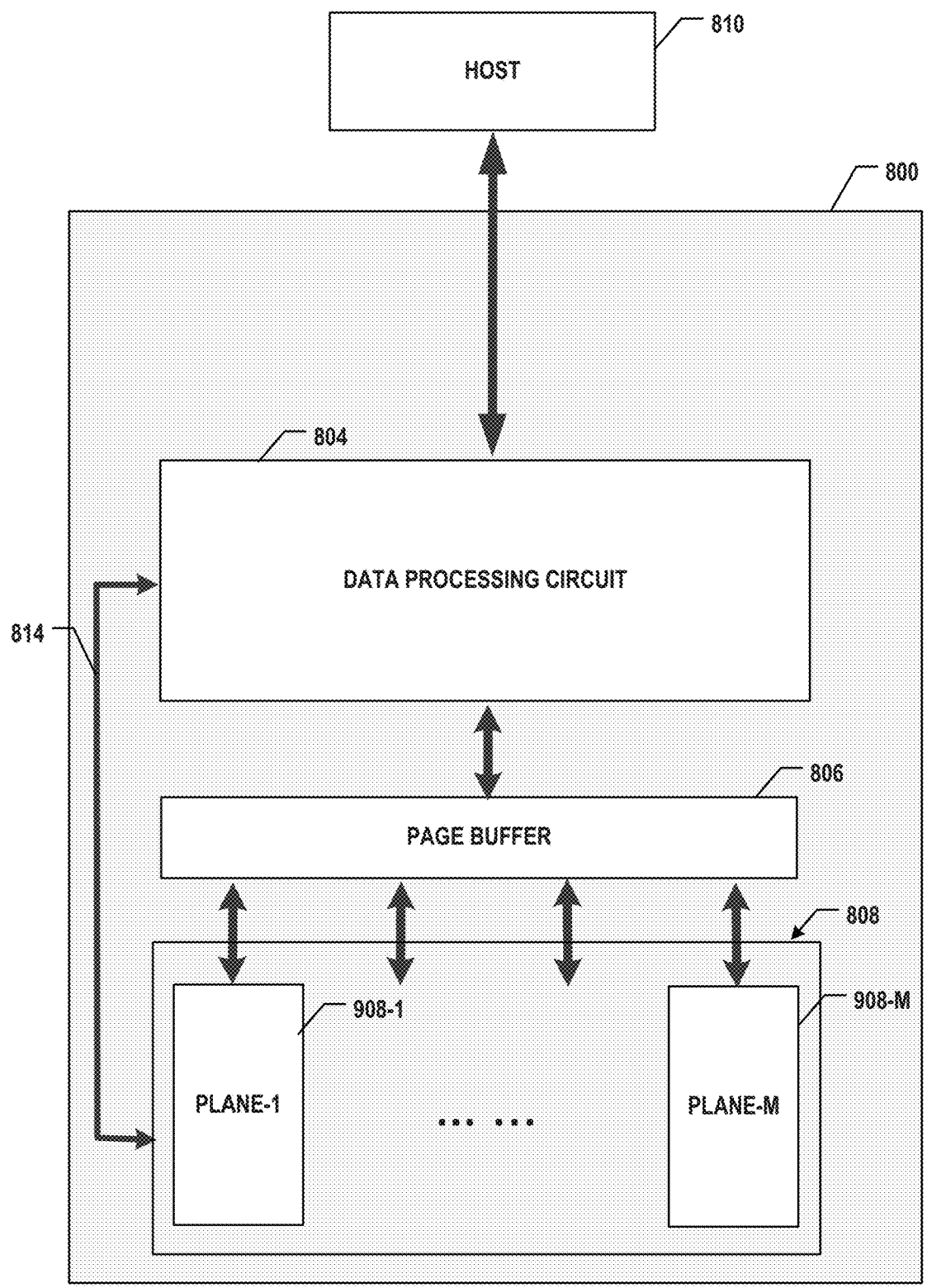
FIG. 9 illustrates a schematic block diagram of an exemplary system having a 3D memory device with a data processing circuit, according to some embodiments.
Figure 10:
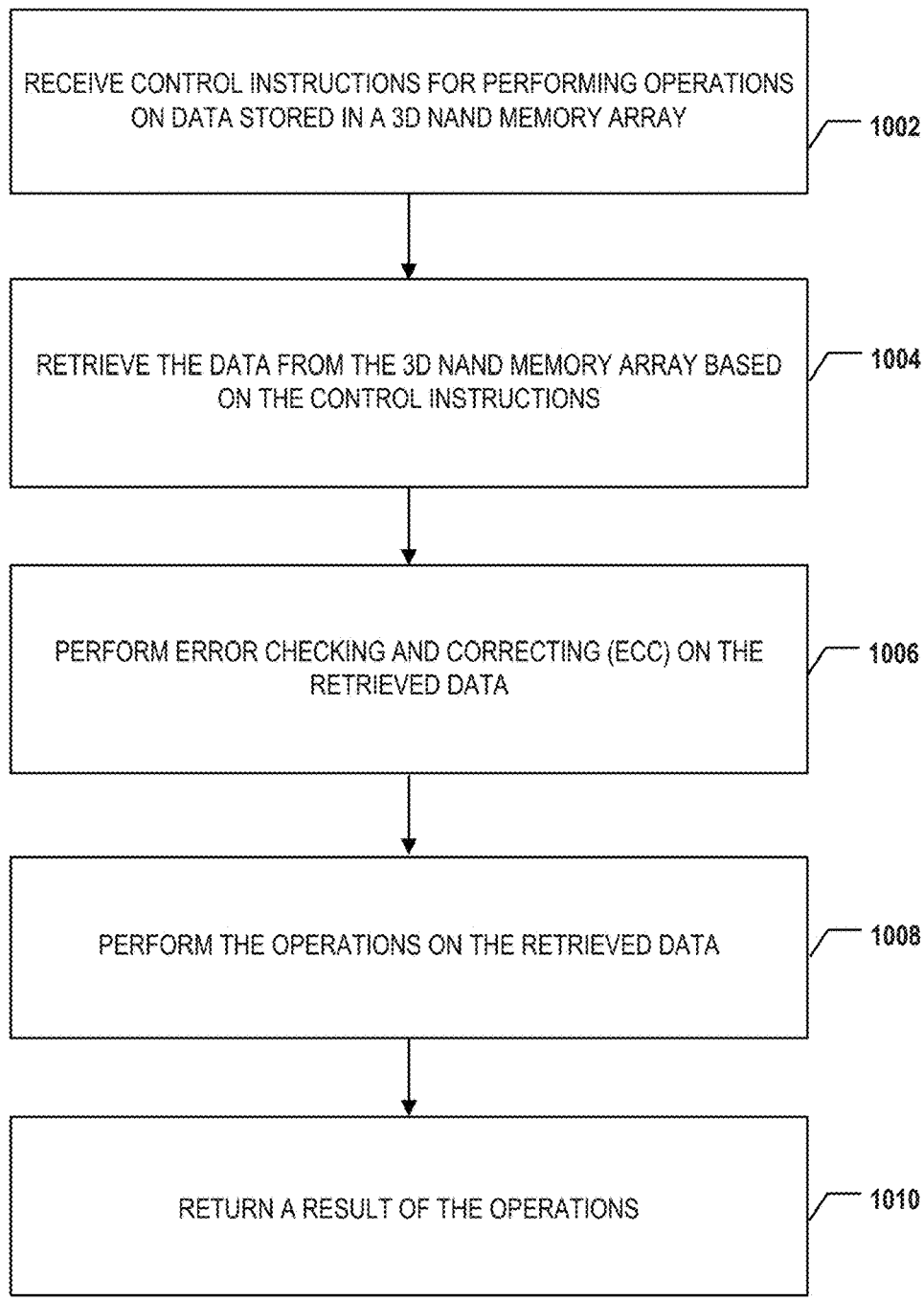
FIG. 10 is a flowchart of an exemplary method for operating a 3D memory device with a data processing circuit, according to some embodiments.

FIG. 8 illustrates a schematic block diagram of an exemplary system 850 having a 3D memory device with an on-die data processing system, according to some embodiments. FIG. 9 illustrates a schematic block diagram of system 920 having a 3D memory device with an on-die data processing circuit, according to some embodiments. FIG. 10 is a flowchart of an exemplary method 1000 for operating a 3D memory device with an on-die data processing circuit, according to some embodiments. The exemplary system illustrated in FIG. 9 is described together with FIG. 10. It is understood that the operations shown in method 1000 is not exhaustive and that other operations can be performed as well before, after, or between any of the illustrated operations. Further, some of the operations may be performed simultaneously, or in a different order than shown in FIG. 10.

FIG. 8 illustrates a system 850 having an on-die data processing circuit, according to some embodiments. System 850 may have a host 810, an I/O interface 802 (also referred to as "I/O" for short), a data processing circuit 804, a page buffer 806, and a 3D NAND memory (also referred to as 3D NAND memory array) 808. In some embodiments, data processing circuit 804 is formed on the same chip with page buffer 806 and 3D NAND memory 808, as described above in detail. In some embodiments, data processing circuit 804, page buffer 806, and 3D NAND memory 808 form a 3D memory device 800. Data processing circuit 804 can be referred to as an on-die data processing circuit, an in-memory computation circuit, an on-NAND data processing circuit, or the like. Data, e.g., program data and control instructions, may be transmitted bi-directionally between host 810 and I/O interface 802, between I/O interface 802 and data processing circuit 804, between data processing circuit 804 and page buffer 806, and between 3D NAND memory 808 and page buffer 806. Data transmission 812 between host 810 and page buffer 806 through I/O interface 802 may be enabled or disabled, depending on the functions of data processing circuit 804. For example, when data processing circuit 804 performs data processing operations locally in 3D memory device 800 and returns or relays the results of the operation to host 810, data transmission 812 may be bypassed or disabled. When data processing circuit 804 is not used to perform data processing operations locally in 3D memory device 800, data transmission 812 can be bi-directional data transmission between host 810 and page buffer 806. That is, when the data processing capability of data processing circuit 804 is invoked, the bulk of data processing operations on the underlying data stored in 3D NAND memory 808 can be performed within 3D memory device 800. As a result, the burden placed on I/O interface 802 due to the transmission of the underlying data from 3D memory device 800 to host 810 can be lifted, as only the operation results are being transmitted through I/O interface 802. On the other hand, when the data processing capability of data processing circuit 804 is not invoked, host 810 may access data stored in 3D NAND memory 808 through I/O interface 802 and page buffer 806, bypassing data processing circuit 804.

Data transmission 814 between data processing circuit 804 and 3D NAND memory 808 allows data processing circuit 804 to directly access data stored in 3D NAND memory 808. In some embodiments, data transmission 814 allows data processing circuit 804 to perform operations based on programs stored in 3D NAND memory 808. The programs may be written in 3D NAND memory 808 by host 810 (e.g., through data transmission 812). In some embodiment, data processing circuit 804 may include FPGA that is programmable based on the programs stored in 3D NAND memory 808. For example, data processing circuit 804 may be programmed and/or re-programmed based on the programs stored in 3D NAND memory 808 to perform various or differing operations.

Host 810 can be any suitable devices that generate data and/or instructions, such as one or more processors. In some embodiments, host 810 includes a central processing unit (CPU), a graphics processor (e.g., graphics processing unit (GPU)), an application processor (AP), a general processor (e.g., APU, accelerated processing unit; GPGPU, general-purpose computing on GPU), or any other suitable processor. I/O interface 802 can be a high-speed, high-throughput input/output circuit as part of the peripheral circuits. In some embodiments, host 810 includes a system controller (e.g., a controller that controls various operations of system 850) and/or a memory controller (e.g., a controller that controls various operations of 3D memory device 800). Any suitable type of data and/or instructions generated by host 810 can be transferred to data processing circuit 804 of 3D memory device 800 through I/O interface 802. For example, host 810 may generate instructions for performing certain operations on data stored in 3D NAND memory 808 and transfer the instructions to data processing circuit 804. Instead of loading all underlying data subject to the operations to host 810 through I/O interface 802, data processing circuit 804 may perform the operations locally, in an on-site and in-memory fashion, and only return the operation result to host 810. Host 810 and 3D memory device 800 can be part of any suitable apparatus, for example, a virtual reality (VR)/augmented reality (AR) device (e.g., VR headset, etc.), handheld device (e.g., dumb or smart phone, tablet, etc.), wearable device (e.g., eyeglasses, wrist watch, etc.), automobile control station, gaming console, television set, laptop computer, desktop computer, netbook computer, media center, set-top box, global positioning system (GPS), printer, or any other suitable device.

In some embodiments, data processing circuit 804 includes a plurality of transistors (e.g., logic transistors). Details of data processing circuit 804 can be found in the description of FIGS. 3, 4, and 5A-5C and thus, are not repeated herein. Data processing circuit 804 may be connected to page buffer 806, which includes a plurality of buffering sections connected to respective pages in 3D NAND memory 808.

Data processing circuit 804 may be employed as an in-memory computation unit of 3D memory device 800 to improve the speed of data operations by, for example, reducing the amount of data occupying the bandwidth of I/O interface 802, thereby improving the overall throughput of system 850. FIG. 9 illustrates a system 920 in which data processing circuit 804 is configured to perform operations on data stored in 3D memory device 800. For ease of depiction, I/O 802 interface is omitted in FIG. 9.

In some embodiments, data are stored in 3D NAND memory 808 in pages, and data processing circuit 804 may retrieve data from 3D NAND memory 808 in the unit of a page. As shown in FIG. 9, 3D NAND memory 808 may be depicted as a plurality of planes 908 (i.e., 908-1, . . . , 908-M, M is a positive integer), each represents memory cells formed by a word line and intersecting memory strings. A plane 908 may include a plurality of pages of memory cells. In operation, data stored in one page of 3D NAND memory 808 may be loaded or cached into page buffer 806 in one batch, which may then be retrieved by data processing circuit 804 as one unit of data. In some embodiments, multiple pages of data may be loaded/cached into one or more page buffers simultaneously. In other embodiments, multiple pages of data may be loaded/cached into one or more page buffers sequentially (e.g., one batch immediately after another batch). Data processing circuit 804 may retrieve cached data from page buffer 806 in parallel (e.g., retrieving multiple pages of data simultaneously) or in series (e.g., retrieving one page of data immediately after another page of data). After retrieving the data in the unit of pages, data processing circuit 804 may perform operations on the retrieved data simultaneously (e.g., processing multiple pages of data at the same time). In some embodiments, data processing circuit 804 may perform operations on the retrieved data sequentially (e.g., processing one page of data immediately after another page of data).

In some embodiments, data processing circuit 804 may access data stored in 3D NAND memory 808 directly through data transmission 814. In this case, data stored in 3D NAND memory 808 may be loaded directly into data processing circuit 804. For example, 3D NAND memory 808 may store program codes executable or configurable by data processing circuit 804 (e.g. data processing circuit 804 may include an FPGA, MCU, ASIC, or the like). The program codes may be loaded to data processing circuit 804 through data transmission 814. Data processing circuit 804 may be programmed based on the program codes to perform operations on data stored in 3D NAND memory 808. In some embodiments, data processing circuit 804 may be re-programmed using different program codes to perform different operations.

Referring to FIG. 10, method 1000 starts at operation 1002, in which 3D memory device 800 receives control instructions from host 810. The control instructions may be issued by host 810 to perform certain operations on data stored in 3D memory device 800 (e.g., stored in 3D NAND memory 808). For example, the control instructions may include performing a searching operation to search for certain record(s) from a database stored in 3D memory device 800. Conventionally, the underlying data of the database need to be transmitted to host 810, where host 810 would perform the searching operation on the data. When the amount of data is large, transmitting the underlying data of the entire database would place a heavy burden on I/O interface 802, limiting the overall system throughput. With on-die, in-memory computation and data processing capability provided by data processing circuit 804, the bulk of the searching operation can be performed in-memory, without burdening I/O interface 802. Once the searching operation is completed, only the search result needs to be transmitted to host 810 through I/O interface 802. This in-memory computation functionality thus can greatly lower the data transmission burden placed on I/O interface 802. In addition, because data processing circuit 804 can be connected to 3D NAND memory array 808 through hybrid bonding, high data transmission rate can be achieved thanks to the short and direct physical connections between data processing circuit 804 and 3D NAND memory array 808. In-memory computation capability provided by data processing circuit 804 can be used to perform various operations within 3D memory device 800 such as searching operations discussed above, data encryption, and data preprocessing operations.

At operation 1004, data processing circuit 804 may retrieve the data from 3D NAND memory array 808 based on the control instructions. As discussed above in connection with FIGS. 8 and 9, data processing circuit 804 may retrieve raw data stored in 3D NAND memory array 808 in the unit of a page and may retrieve data stored in multiple pages simultaneously or sequentially. Take searching operations, for example, host 810 may instruct data processing circuit 804 to perform searching operations to search for certain records from data stored in 3D NAND memory 808. Instead of transmitting the raw data to host 810, data processing circuit 804 may perform the search operations within 3D memory device 800 based on, for example, a search program stored in 3D NAND memory array 808. In other words, data processing circuit 804 may be programmed to perform the search operation using program codes stored locally in 3D NAND memory array 808 to perform the search operation on raw data stored in 3D memory device 800. Data stored in pages of 3D memory device 800 can be retrieved in batches, for example, one page at a time, by data processing circuit 804. In some embodiments, data retrieval can be performed in parallel such that multiple pages of data can be loaded into data processing circuit 804 for processing simultaneously. In other embodiments, data retrieval can be performed sequentially such that data processing circuit 804 retrieves one page at a time.

At operation 1006, data processing circuit 804 may perform error checking and correcting (ECC) operations on the retrieved data. For example, data processing circuit 804 may include a built-in ECC controller to perform the ECC operations. In some embodiments, the built-in ECC controller may be formed together with other components (e.g., logic transistors) of data processing circuit 804. In some embodiments, the ECC controller may be implemented by programming data processing circuit 804 based on, for example, program codes stored in 3D NAND memory array 808. In another example, data processing circuit 804 may connect to an external ECC controller. The external ECC controller may be part of the peripheral circuits 312/442. In some embodiments, the external ECC controller may be outside 3D memory device 800 and connected to data processing circuit 804. It is noted that ECC operations may be omitted in some applications.

At operation 1008, data processing circuit 804 may perform the operations on the retrieved data locally in-memory. In the searching operation example, data processing circuit 804 may traverse the raw data retrieved from pages of 3D NAND memory array 808 to search for the records that meet the searching criteria. Because data transmission between data processing circuit 804 and 3D NAND memory array 808 can achieve high speed thanks to the hybrid bonding technology discussed above, the searching operations can be performed very efficiently, without burdening I/O interface 802 that is designed for general data transmission among components of system 850. In another example, data processing circuit 804 may perform data encryption/decryption on the data stored in 3D NAND memory array 808 and store the encrypted/decrypted data back to the memory cells of 3D memory device 800. The encrypted/decrypted data may replace the original data or be stored in different memory cells. Similarly, data processing circuit 804 may perform data compression/decompression, data preprocessing/preconditioning, image rendering, feature leaning/model training, or any other operations requiring logic computation to a large amount of data.

At operation 1010, data processing circuit 804 may return a result of the operations to host 810 via I/O interface 802. For example, the result of searching operations may include one or more records that meet that searching criterion. In another example, the result of encryption operations may include a confirmation code, a key, a checksum, or the like. In any case, the underlying data upon which these operations are performed need not be transmitted to host 810 via I/O interface 802, relieving I/O interface 802 from carrying heavy data traffic.

3D NAND memory 808 may include a multi-level cell (MLC) NAND memory device, in which a number of the plurality of pages corresponds to a number of bits stored in a memory cell. In some embodiments, 3D NAND memory 808 includes a triple-level cell (TLC) NAND memory device packed in a RAM-less application environment, such as an eMMC or a UFS.

In some embodiments, a 3D memory device includes a first semiconductor structure including a peripheral circuit, a data processing circuit, and a first bonding layer including a plurality of first bonding contacts. The 3D memory device also includes a second semiconductor structure including an array of 3D NAND memory strings and a second bonding layer including a plurality of second bonding contacts. In addition, the 3D memory device includes a bonding interface between the first bonding layer and the second bonding layer. The first bonding contacts are in contact with the second bonding contacts at the bonding interface.

In some embodiments, the first semiconductor structure includes a substrate and the peripheral circuit on the substrate. The first semiconductor structure also includes the data processing circuit on the substrate and non-overlapping with the peripheral circuit. In addition, the first semiconductor structure includes the first bonding layer above the peripheral circuit and the data processing circuit.

In some embodiments, the second semiconductor structure includes the second bonding layer above the first bonding layer and a memory stack above the second bonding layer. The second semiconductor structure also includes the array of 3D NAND memory strings extending vertically through the memory stack. The second semiconductor structure further includes a semiconductor layer above and in contact with the array of 3D NAND memory strings.

In some embodiments, the 3D memory device includes a pad-out interconnect layer above the semiconductor layer.

In some embodiments, the semiconductor layer includes at least one of polysilicon or single-crystal silicon.

In some embodiments, the second semiconductor structure includes a substrate and a memory stack above the substrate. The second semiconductor structure also includes the array of 3D NAND memory strings extending vertically through the memory stack. The second semiconductor structure further includes the second bonding layer above the memory stack and the array of 3D NAND memory strings.

In some embodiments, the first semiconductor structure includes the first bonding layer above the second bonding layer and the peripheral circuit above the first bonding layer. The first semiconductor structure also includes the data processing circuit above the first bonding layer and non-overlapping with the peripheral circuit. The first semiconductor structure further includes a semiconductor layer above and in contact with the peripheral circuit and the data processing circuit.

In some embodiments, the 3D memory device includes a pad-out interconnect layer above the semiconductor layer.

In some embodiments, the peripheral circuit and the data processing circuit are stacked one over another.

In some embodiments, the data processing circuit includes a field-programmable gate array (FPGA).

In some embodiments, the data processing circuit includes a microcontroller unit (MCU) or an application-specific integrated circuit (ASIC).

In some embodiments, the first semiconductor structure includes a first interconnect layer vertically between the first bonding layer and the data processing circuit, and the second semiconductor structure includes a second interconnect layer vertically between the second bonding layer and the array of 3D NAND memory strings.

In some embodiments, the data processing circuit is electrically connected to the array of 3D NAND memory strings through the first and second interconnect layers and the first and second bonding contacts.

In some embodiments, the 3D memory device is packaged in at least one of an embedded multi-media card (eMMC) or a universal flash storage (UFS).

In some embodiments, a method for forming a three-dimensional (3D) memory device includes forming a first semiconductor structure including a peripheral circuit, a data processing circuit, and a first bonding layer including a plurality of first bonding contacts. The method also includes forming a second semiconductor structure including an array of 3D NAND memory strings and a second bonding layer including a plurality of second bonding contacts. The method further includes bonding the first semiconductor structure and the second semiconductor structure in a face-to-face manner, such that the first bonding contacts are in contact with the second bonding contacts at a bonding interface.

In some embodiments, to form the first semiconductor structure, the method includes forming the peripheral circuit and the data processing circuit on a first substrate, forming a first interconnect layer above the peripheral circuit and the data processing circuit, and forming the first bonding layer above the first interconnect layer.

In some embodiments, forming the data processing circuit includes forming a field-programmable gate array (FPGA) on the first substrate.

In some embodiments, forming the data processing circuit includes forming a microcontroller on the first substrate.

In some embodiments, to form the second semiconductor structure, the method includes forming a memory stack above a second substrate, forming the array of 3D NAND memory strings extending vertically through the memory stack, forming a second interconnect layer above the array of 3D NAND memory strings, and forming the second bonding layer above the second interconnect layer.

In some embodiments, the second semiconductor structure is above the first semiconductor structure after the bonding.

In some embodiments, the method includes thinning the second substrate to form a semiconductor layer after the bonding and forming a pad-out interconnect layer above the semiconductor layer.

In some embodiments, the first semiconductor structure is above the second semiconductor structure after the bonding.

In some embodiments, the method includes thinning the first substrate to form a semiconductor layer after the bonding and forming a pad-out interconnect layer above the semiconductor layer.

In some embodiments, the bonding includes hybrid bonding.

In some embodiments, a method for operating a three-dimensional (3D) memory device including an input/output circuit, a data processing circuit, and an array of 3D NAND memory strings in a same chip includes transferring control instructions through the input/output circuit to the data processing circuit. The method also includes processing, by the data processing circuit, data stored in the array of 3D NAND memory strings based on the control instructions. The method further includes returning, through the input/output circuit, a data processing result.

In some embodiments, the method includes transferring the data between the array of 3D NAND memory strings and the data processing circuit through a plurality of bonding contacts.

In some embodiments, the array of 3D NAND memory strings includes a plurality of pages. Processing the data by the data processing circuit includes processing the data in a unit of a page.

In some embodiments, processing the data by the data processing circuit includes processing data stored in multiple pages simultaneously.

In some embodiments, processing the data by the data processing circuit includes processing data stored in multiple pages sequentially.

In some embodiments, processing the data by the data processing circuit includes at least one of information searching, data encryption, or data preprocessing.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
a first semiconductor structure comprising a peripheral circuit, a data processing circuit, and a first bonding layer comprising a plurality of first bonding contacts;
a second semiconductor structure comprising an array of 3D NAND memory strings and a second bonding layer comprising a plurality of second bonding contacts; and
a bonding interface between the first bonding layer and the second bonding layer, wherein
the first bonding contacts are in contact with the second bonding contacts at the bonding interface,
the first semiconductor structure is above the second semiconductor structure, and
the first semiconductor structure further comprises a semiconductor layer above the first bonding layer, and a pad-out interconnect layer above the semiconductor layer.

2. The 3D memory device of claim 1, wherein the semiconductor layer comprises at least one of polysilicon or single-crystal silicon.

3. The 3D memory device of claim 1, wherein the second semiconductor structure comprises:
a substrate;
a memory stack above the substrate;
the array of 3D NAND memory strings extending vertically through the memory stack; and
the second bonding layer above the memory stack and the array of 3D NAND memory strings.

4. The 3D memory device of claim 3, wherein in the first semiconductor structure:
the first bonding layer is above the second bonding layer;
the peripheral circuit is above the first bonding layer;
the data processing circuit is above the first bonding layer and non-overlapping with the peripheral circuit; and
the semiconductor layer is above and in contact with the peripheral circuit and the data processing circuit.

5. The 3D memory device of claim 1, wherein the data processing circuit comprises a field-programmable gate array (FPGA).

6. The 3D memory device of claim 1, wherein the first semiconductor structure comprises a first interconnect layer vertically between the first bonding layer and the data processing circuit, and the second semiconductor structure comprises a second interconnect layer vertically between the second bonding layer and the array of 3D NAND memory strings.

7. The 3D memory device of claim 6, wherein the data processing circuit is electrically connected to the array of 3D NAND memory strings through the first and second interconnect layers and the first and second bonding contacts.

8. The 3D memory device of claim 1, wherein the pad-out interconnect layer comprises one or more interconnects in an interlayer dielectric (ILD) layer.

9. The 3D memory device of claim 8, wherein the interconnects comprise contact pads.

10. The 3D memory device of claim 1, wherein the pad-out interconnect layer is configured to transfer electrical signals between the 3D memory device and one or more outside circuits outside the 3D memory device.

11. The 3D memory device of claim 10, wherein the peripheral circuit and the data processing circuit are electrically connected to the one or more outside circuits through the pad-out interconnect layer.

12. The 3D memory device of claim 6, wherein the first semiconductor structure further comprises one or more contacts extending through the semiconductor layer to electrically connect the pad-out interconnect layer with the first interconnect layer.

13. The 3D memory device of claim 1, wherein the peripheral circuit and the data processing circuit are stacked over one another on different planes.

14. The 3D memory device of claim 1, wherein the array of 3D NAND memory strings comprise a plurality of floating gate NAND memory strings, and the semiconductor layer comprises a source plate of the plurality of floating gate NAND memory strings.

* * * * *